(12) United States Patent
Karjalainen et al.

(10) Patent No.: US 7,286,674 B2
(45) Date of Patent: Oct. 23, 2007

(54) METHOD FOR DESIGNING A MODAL EQUALIZER FOR A LOW FREQUENCY AUDIBLE RANGE ESPECIALLY FOR CLOSELY POSITIONED MODES

(75) Inventors: Matti Karjalainen, Espoo (FI); Poju Antsalo, Helsinki (FI); Vesa Välimäki, Espoo (FI); Aki Mäkivirta, Lapinlahti (FI)

(73) Assignee: Genelec Oy, Iisalmi (FI)

( * ) Notice: Subject to any disclaimer, the term of this patent is extended or adjusted under 35 U.S.C. 154(b) by 785 days.

(21) Appl. No.: 10/481,114

(22) PCT Filed: Apr. 22, 2003

(86) PCT No.: PCT/FI03/00321

§ 371 (c)(1),
(2), (4) Date: Dec. 17, 2003

(87) PCT Pub. No.: WO03/096743

PCT Pub. Date: Nov. 20, 2003

(65) Prior Publication Data

US 2005/0175193 A1    Aug. 11, 2005

(30) Foreign Application Priority Data

May 7, 2002    (FI)    ................... 20020865

(51) Int. Cl.
*H04B 3/20*    (2006.01)
(52) U.S. Cl. .......................................... 381/66; 381/98
(58) Field of Classification Search ............... 381/66, 381/98, 103, 83, 95, 96; 708/322; 73/659
See application file for complete search history.

(56) References Cited

U.S. PATENT DOCUMENTS

| | | | |
|---|---|---|---|
| 6,442,280 B1 * | 8/2002 | Ito | 381/83 |
| 6,779,404 B1 * | 8/2004 | Brincker et al. | 73/659 |
| 2004/0091120 A1 * | 5/2004 | Kantor et al. | 381/98 |

* cited by examiner

*Primary Examiner*—Ping Lee
(74) *Attorney, Agent, or Firm*—Birch, Stewart, Kolasch & Birch, LLP

(57) ABSTRACT

The present invention relates to a method for designing a modal equalizer (5) for a low frequency audible range, typically for frequencies below 200 Hz for a predetermined space (1) (listening room) and location (2) (location in the room) therein, in which method modes to be equalized are determined at least by center frequency and decay rate of each mode, creating a discrete-time description of the determined modes, and determining equalizer filter coefficients on the basis of the discrete-time description of the determined modes, and forming the equalizer (5) by means of a digital filter by defining the filter coefficients on the basis of the properties of the modes. In accordance with the invention following method steps are used: forming a mode detection function ($G(\Omega)$), defining the highest peak angular frequency $\Omega_p$ of the function ($G(\Omega)$), making AR analysis of predefined order for solving the poles of the mode representing the highest peak angular frequency, selecting the pole closest to point $e^{j\Omega_p}$ on the unit circle, determining the decay time of the mode and if is over a predetermined level, designing a modal correction filter for this mode, and repeating this procedure until no decay time exceeds over the predetermined level, and each individual filter obtained in previous stages of the method is combined to a cascaded filter.

21 Claims, 14 Drawing Sheets

METHOD FOR DESIGNING A MODAL EQUALIZER FOR A LOW FREQUENCY AUDIBLE RANGE ESPECIALLY FOR CLOSELY POSITIONED MODES

BACKGROUND OF THE INVENTION

Field of the Invention

The invention relates to a method for designing a modal equalizer for a low frequency audible range especially for closely positioned modes.

SUMMARY AND OBJECTS OF THE INVENTION

Parametric analysis and modeling is an increasingly common task in acoustics and audio. In this invention we focus on such audio related problems where a target system response can be measured and the task is to model it for computational simulation/synthesis or to inverse model it for equalization, i.e., compensation for nonidealities in the observed response. Representative examples of the first group, forward simulation for synthesis, are room response modeling including artificial reverb design, or just estimation of eigenmodes at low frequencies in room acoustical studies, and modeling of musical instruments. The second category, the inverse modeling is common in audio, where equalization of non-ideal response properties is a frequent task in high-quality sound reproduction, as well as prevention of acoustic feedback in sound reinforcement systems.

The behavior of acoustic/audio systems at low frequencies can often be modeled analytically and parametrized, at least with lumped models, for example low-frequency modal behavior of a rectangular room [1], musical instrument body [2], or loudspeaker enclosure [3]. For irregular structures and/or higher frequencies it is much more difficult or impossible to find analytical or numerical models that are useful in practice. In such cases it is still possible to measure system responses and to apply signal modeling techniques to analyze, simulate, or real-time synthesize a given response.

Particular interest in this study here is focused on the resonant and reverberating characteristics of complex acoustic systems. The modal behavior, i.e., decomposition of eigenmodes assuming a linear and time-invariant (LTI) system, can be extremely complicated. In one-dimensional resonators, such as strings and tubes in musical instruments, the density of eigenmodes is not necessarily high, but these modes can exhibit complicated details, for example two-stage decay and strong beating in a decaying envelope. In 2-D and 3-D resonators, such as membranes, plates, and enclosed spaces, the modal density increases towards higher frequencies, resulting in dense modal patterns and reverberation type behavior when neighboring eigenmodes overlap essentially. Also the temporal behavior becomes complex, especially in rooms where the direct sound and early reflections are followed by an increasing density of reflections resulting in late reverberation. Thus the problem of modeling measured responses may benefit of a time-frequency modeling viewpoint where the properties of auditory perception are also taken into account.

A rich literature exists on signal modeling of LTI systems [4, 5, 6, 7] from many branches of engineering, systems sciences, and applications. Software tools for modeling are available, for example in MATLAB. Here we utilize particularly the functions found in the Signal Processing Toolbox [8]. Another MATLAB toolbox of interest is the System Identification Toolbox [9]. Here we assume that the target system and the desired model are, in addition to linearity and time invariance, also stable and causal. We also assume that the measured response is not heavily noise-contaminated so that estimating the system model parameters is practical for the applications at hand. Then the measured impulse response h(n) can be approximated by a rational expression in the z-transform domain by $$H(z) = \frac{b_0 + b_1 z^{-1} + \ldots + b_N z^{-N}}{1 + a_1 z^{-1} + \ldots + a_P z^{-P}} = \frac{\sum_{k=0}^{N} b_k z^{-k}}{1 + \sum_{k=1}^{P} a_k z^{-k}} \quad (1)$$

which makes it possible to efficiently simulate or synthesize the system by various digital filter implementations [5, 10, 11] of the given transfer function.

In this invention we only deal with discrete-time representations for digital signal processing. Thus the easiest way "to model" a measured response h(n) or its truncated/windowed version is to take it directly as an FIR filter $$H(z) = \sum_{k=0}^{N} h(k) z^{-k}$$

For complex systems, the length of a finite impulse response required for suitable representation may be too long, preventing real-time implementations. On the other hand, shortening the filter length reduces the capabilities of identifying the inherent resonant properties of the system under study. IIR filters for infinite impulse response can come in two forms: (a) all-pole models where the numerator of Eq. (1) is reduced to a single gain coefficient $b_0$ or (b) pole-zero models with both the numerator and denominator being non-trivial polynomials of z.

In systems science and engineering, for example in control theory for estimation and identification tasks, the terms autoregressive (AR), moving average (MA), and autoregressive moving-average (ARMA) have been used for modeling processes similar to all-pole, FIR, and pole-zero filter modeling, respectively. For the sake of convenient use of abbreviations AR and ARMA, as well as to draw attention to the rich knowledge from various other fields than digital audio signal processing, we apply the terms MA, AR, and ARMA here when referring to specific types of models.

Our aim does not stop in obtaining a useful approximation of a measured target system by a transfer function of Eq.(1). We are interested in decomposing it into a parametric description of its constituent components, particularly the complex-conjugate pole pairs, i.e., the complex-valued roots of the denominator polynomial, which represent the eigenmodes of the system and result in the resonant and reverberant behavior. In theory they are common in spatially distributed systems such as a room [12] or an instrument body, while zeros $$\left( \text{roots of the numerator} \sum_{k=0}^{N} b_k z^{-k} \right)$$

are essentially position-dependent. We are interested in accurate estimation of modal parameters, such as pole angle and radius or, equivalently, mode frequency and decay coefficient.

In [13] we studied this problem of modal parameter estimation using traditional time-frequency analysis techniques by first trying to isolate potential mode frequencies and then estimating the modal decay rate from a spectrogram, such as short-time Fourier analysis or cumulative decay spectrum [14]. Decay rate estimation was also applied to wide-band signals, for example to robust estimation of reverberation time $T_{60}$. The problem with such methods is to model overlapping modes that result in non-exponential decay in any reasonable frequency span. AR and ARMA approaches try to model the target response as a whole by minimizing a given modeling error criterion, typically a least squares (LS) error. Thus the interactions of overlapping modes are taken into account simultaneously and systematically.

One problem of straightforward optimization is the inflexibility of the global optimization criteria, for example to take into account the properties of different modes. Also the selection of proper values for the order parameters N and P of Eq.(1) is not easy. A practical problem is that solving the (complex-valued) roots of a high-order polynomial is a difficult numerical task. To avoid problems with high-order models we use methods where a part of the given audio frequency range is modeled at a time to obtain an accurate description of the modes within this frequency span. Frequency zooming ARMA modeling (FZ-ARMA) is shown to be a powerful way to decompose highly complex resonant responses into modal representations, and related IIR filter implementations can be used for simulation and synthesis of such systems. Our research is particularly influenced by earlier studies on selective linear prediction [15], multiband modeling of musical signals [16] or loudspeaker responses [17], and other high-resolution system modeling techniques.

This patent application is structured as follows. Sections 2 and 3 present an overview of AR and ARMA modeling methods and techniques. Examples are given to illustrate the modeling ability and limitations of these basic approaches. Section 4 introduces the Frequency-Zooming ARMA (FZ-ARMA) method that is able to analyze high-order systems with overlapping modes and dense modal distributions. The effects of nonidealities, including noise and non-LTI behavior, are discussed. Three cases of audio applications that use AR/ARMA/FZ-ARMA methods are described in Section 5, including modeling of measured room responses, inverse modeling and equalization of loudspeaker-room responses, and modeling as well as sound synthesis of musical instruments.

2 AR Modeling

The impulse response of a resonant system shows one or more exponentially decaying sinusoids. Each such 'mode' can be inherently modeled by a complex conjugate pole pair, which suggests AR modeling with corresponding infinite impulse response (IIR) filters. There is a long tradition for finding least squares optimal fit of such models to measured LTI system responses, either to a given impulse response or to input-output signal pairs. Here we shortly refer to the theory of linear prediction (LP) which has found application especially as a powerful spectral modeling technique in speech processing [18, 19].

2.1 Linear Prediction

In linear prediction a signal sample x(n) is assumed to be predictable as a linear combination of previous samples $$\hat{x}(n) = \sum_{i=1}^{P} a_i x(n-i)$$

When the least squares prediction error between x(n) and $\hat{x}(n)$ is minimized, the (auto)correlation coefficients $$r_x(k) = \sum_{i=0}^{P-1} x(i)x(i+k) \quad (2)$$

play central role.

The most frequently used version of LP analysis is the autocorrelation method, where the optimal model parameters $a_i$ are solved from a linear matrix equation (normal equations)

$$\begin{bmatrix} r_0 & r_1 & r_2 & \cdots & r_{P-1} \\ r_1 & r_0 & r_1 & \cdots & r_{P-2} \\ r_2 & r_1 & r_0 & \cdots & r_{P-3} \\ \cdots & \cdots & \cdots & \cdots & \cdots \\ r_{P-1} & r_{P-2} & r_{P-3} & \cdots & r_0 \end{bmatrix} \begin{bmatrix} a_1 \\ a_2 \\ a_3 \\ \cdots \\ a_P \end{bmatrix} = \begin{bmatrix} r_1 \\ r_2 \\ r_3 \\ \cdots \\ r_P \end{bmatrix} \quad (3)$$

Here, $r_k$ are the autocorrelation coefficients $r_x(k)$ from Eq.(2) for a signal frame under study and P is the order of LP analysis (order of the all-pole model filter). The coefficients $a_i$ are the estimated polynomial coefficients in the denominator of Eq.(1), i.e., $$1 + \sum_{k=1}^{P} a_k z^{-k}$$

the numerator being only a gain coefficient. Linear predictive analysis is computed in MATLAB by function "1pc", which first solves the autocorrelation coefficients $r_k$ and then inverts the Toeplitz type correlation matrix to yield predictor coefficients $a_i$ through levinson recursion function [8].

2.2 Limitations of AR Modeling

A problem with AR modeling of real-world systems, in the formulation described above, is that the method is not able to do time domain fitting to given target response unless the target process is strictly of AR (all-pole) type. FIG. 1 illustrates this clearly in a simple case of one idealized mode. For a damped sinusoid in FIG. 1(a) the model response in FIG. 1(e) is a very accurate replica of the target already with model order of 2 (one complex conjugate pole pair). If the initial phase is changed 90 degrees to a damped cosine function, the second order AR model response (solid line) in FIG. 1(f) severely falls off from the given target in FIG. 1(b).

Further insight into the behavior of AR modeling is gained by noticing that the model is based entirely on the autocorrelation coefficients, which in the frequency domain corresponds to the power spectrum. This means pure spectral modeling, whereby the spectrum of the cosine case in FIG. 1(d) clearly deviates from the spectrum of sine case response in FIG. 1(c). Irregular onsets are common in acoustic system responses, thus indicating that simple AR modeling will have difficulties, and that more powerful methods are needed in accurate temporal modeling.

A somewhat better match to the decaying cosine tail above can be achieved by the covariance method of AR analysis but the phase matching problem remains and requires ARMA modeling. The covariance method function "ar", option "ls", can be found in the System Identification Toolbox of Matlab.

3 ARMA modeling

ARMA modeling, yielding a pole-zero filter, has more modeling power than the AR method. It is however more difficult because no closed-form solutions are available, thus requiring nonlinear optimization. ARMA estimation algorithms are iterative, starting from a good AR model and then iterating towards optimal parameter values. As with any nonlinear optimization methods, problems of divergence or convergence to a local optimum may occur, and plain computational problems due to the lack of numerical precision are found.

Two methods are applied below: Prony's method and Steiglitz-McBride method (These methods are available as Matlab Signal Processing Toolbox functions prony and stmcb). A brief discussion is given on the problem of model order selection followed by motivation of the need for improved frequency resolution, before introducing the frequency-zooming ARMA technique.

3.1 Prony's Method

Prony's method [20, pp. 226-228] is a stepwise algorithm that fits N+1 first samples of given response exactly, while P poles of the denominator in Eq.(1) take care of tail decay fitting. Because the AR part estimation is of covariance type, the resulting filter can become unstable, even in cases where the target system to be modeled is stable.

3.2 Steiglitz-McBride Iteration

Steiglitz-McBride method [7, pp. 174-177] is an algorithm with iterative prefiltering for least squares fit of an ARMA model of Eq.(1) to a given impulse response or given input-output pair (system identification problem). An initial estimate for the denominator can be obtained for example by Prony's method. As with Prony's method, the resulting filter from the Steiglitz-McBride iteration can be unstable especially with high filter orders even for stable target systems. Often the model response starts in good match with the given time domain response (since this is LS fitting) but after some time it starts to explode due to pole(s) outside the unit circle.

3.3 Model Order Selection

Both AR and ARMA models need careful selection of filter orders N and P (N=0 for AR models). There is no general and automatic way to select optimal filters order(s), rather they can be searched for by various rules to obtain good enough match to a given target response [21] or the order(s) can be approximated using a priori information about the target system to be modeled.

An illustrative example on how the order of AR modeling (linear prediction) affects the estimated modal frequencies (pole angles) is shown in FIG. 2. The magnitude spectrum of a measured room response is plotted in comparison with a related pole frequency bifurcation map. For lowest orders only the spectral peak ranges become roughly approximated, and for increasing model order these poles split into new pole pairs and groups of poles.

In this study we are interested in modeling resonant and reverberant systems by methods where the poles and related parameters, angles and radii, can be resolved explicitly. This is needed in applications such as those discussed below in the application section. The selection of model order is then more demanding than in cases where finding the numerator and denominator coefficients is enough. If the model order is too low, not all modes are represented properly by complex conjugate pole pairs, or the radii of poles found remain underestimated. If a model order is too high, single modes often become overmodeled, i.e., more than one pole pair will become allocated per mode.

3.4 Limitations of ARMA Modeling

While powerful in simple cases for low model orders, the methods described above exhibit difficulties with high orders and complex target systems. Often these problems originate from limited computational precision. In Prony's method and the Steiglitz-McBride iteration the potential instability is often a problem. Although poles outside the unit circle can be mirrored inside the unit circle, yielding an equivalent magnitude spectrum, the temporal structure of the impulse response is changed.

Linear prediction (autocorrelation method) may yield stable and accurate results with model orders of hundreds or thousands, particularly when the poles are not very close to the unit circle or to each others. However, if the poles (and zeros) must be solved explicitly, which is of interest in this study, solving for roots of the denominator (and numerator) is typically more problematic than obtaining these polynomials per se. Frequency-selective AR and ARMA modeling solves some of these problems.

The present invention differs from the prior art in that a mode detection function is formed, highest peak angular frequency $\Omega_p$ of the function is found, AR analysis of predefined order is made for identifying the corresponding poles, selecting the pole closest to point $e^{i\Omega_p}$ on the unit circle, decay time of the mode is determined and if it is over a predetermined level, a modal correction filter is designed for this mode, procedure is repeated and if no decay time exceeds over, a cascaded filter is formed from each individual filter.

The invention offers substantial benefits.

With help of the invention also modes close to each other can be equalized effectively.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings, which are given by way of illustration only, and thus are not limitative of the present invention, and wherein.

DETAILED DESCRIPTION OF THE PREFERRED EMBODIMENTS

4 Frequency-zooming ARMA (FZ-ARMA)

Figure 1:
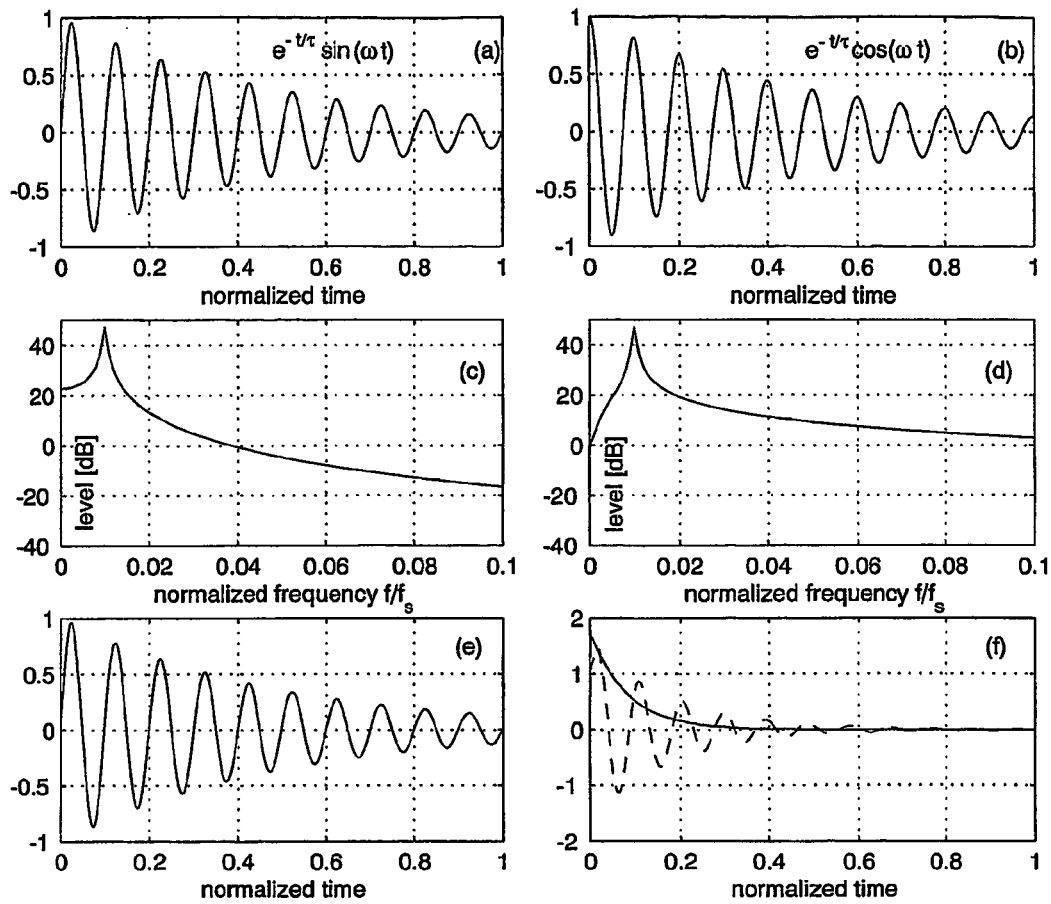
FIG. 1 shows AR modeling of single mode decay with different initial phase: (a) spectrum of sine response, (d) magnitude spectrum of cosine response, (e) AR model response for sinusoidal response with order of 2, and (f) AR model response for cosine case with order of 2 (solid line) and order of 20 (dashed line).
Figure 2:
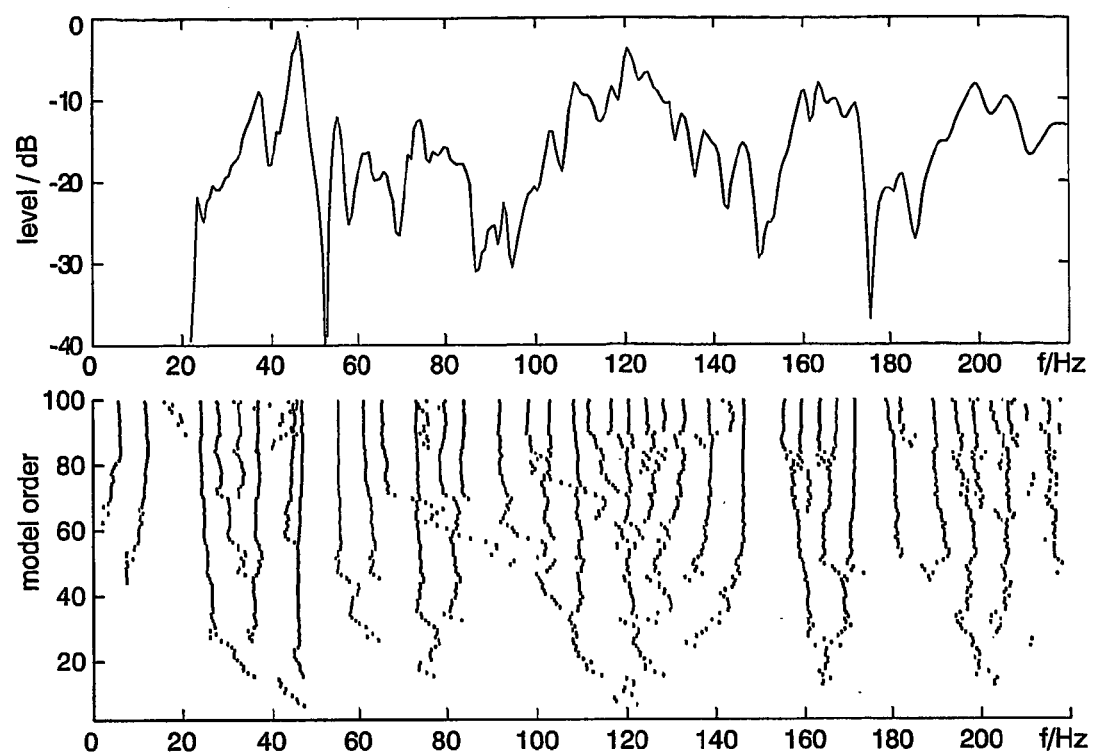
FIG. 2 shows magnitude spectrum of a measured room response (top) and frequencies corresponding to pole angles obtained from linear prediction of varying order (bottom).

The problems in resolving very closely positioned modes and mode groups was the reason in this study to experiment with methods that have better control over frequency resolution. Several ideas are available for improvement, including frequency warping [22] and frequency selective modeling such as selective linear prediction [15], multiband AR/ARMA techniques [16], and many other high-resolution signal modeling methods.

Frequency warping is a convenient technique when either lowest or highest frequencies require enhanced frequency resolution. This approach can be extended to Kautz filters that exhibit interesting properties of generalized frequency resolution control [23].

Frequency selective modeling has been applied for example in linear prediction of speech. In a simple case a target response can be low-pass filtered and decimated in order to model the low-frequency part of the response. A range of higher frequencies can be modulated down and decimated before similar modeling. Actually any subband of a given frequency range can be modeled this way, and finally the resulting parameters (poles and zeros) can be mapped back to the corresponding original frequency range. This approach is called here modeling by frequency zooming. It resembles also the multiband techniques used in [16, 17, 24].

4.1 Formulation of Frequency Zooming

The FZ-ARMA (or FZ-AR) analysis starts by modulating (heterodyning) the desired frequency range down to the neighborhood of zero frequency [25, 26, 27] by $$h_m(n)=e^{i\Omega_m n}h(n) \quad (4)$$

where $\Omega_m=2\pi f_m/f_s$, $f_m$ is the modulation frequency, and $f_s$ is the sample rate. In the z-domain this means clockwise rotation of poles $z_i$ by angle $\Omega_m$, i.e., $$\Omega_{i,rot}=\Omega_i-\Omega_m=arg(z_i)-\Omega_m \quad (5)$$

but retaining the pole radius. The next step to increase frequency resolution is to limit the frequency range by decimating, i.e., lowpass filtering and down-sampling the rotated response by a zooming factor $K_{zoom}$ to obtain a new sampling rate $f_{s,zoom}=f_s/K_{zoom}$. This implies mapping to a new z-domain where poles are scaled by the rule $$z_{i,zoom}=z_i^{K_{zoom}} \quad (6)$$

Together mappings (5) and (6) yield new poles. Eqs.(5) and (6) characterize how the z-domain properties of a given response are changed through modulation and decimation, but the estimated pole-zero pattern of an ARMA model will be obtained only in the next step.

$$\hat{z}_i=|z_i|^{K_{zoom}}e^{j(arg(z_i)-\Omega_m)K_{zoom}} \quad (7)$$

Now it is possible to apply any AR or ARMA modeling to the modulated and decimated response obtained from h(n). Notice that this new signal is complex-valued due to the one-sided modulation operation. This approach resembles multirate and subband techniques.

The advantage gained by frequency zooming is that in the zoomed subband the order of (ARMA) analysis can be reduced by increasing the zooming factor $K_{zoom}$ and, consequently, the solution of poles and zeros as roots of denominator and numerator polynomials of the model function Eq.(1) is simplified. Additionally this means that a different resolution can be used in each subband, for example based on knowledge about the modal complexity in each subband.

After solving the poles and zeros within a zoomed subband, they must be remapped to the full band. This means inverse scaling the radii of poles as well as rotating them counter-clockwise, i.e., $$z_i=\hat{z}_i^{(1/K_{zoom})}e^{j\Omega_m} \quad (8)$$

Due to the one-sided down-modulation in (4), each pole $z_i$ must be used as a complex conjugate pair in order to obtain real-valued filters.

The final step is to combine poles and zeros obtained from different subbands into a full model. This is a non-trivial task but on the other hand, partitioning of the whole problem and recombining again brings increased flexibility. It is advantageous to pick poles and zeros only within the central part of each (overlapping) subband to avoid problems at the boundaries of subbands due to band-limitation.

In the investigations of FZ-ARMA below the frequency-zooming method of solving the ARMA coefficients is the Steiglitz-McBride method. Notice also that the filter orders N and P refer to real-valued filters with complex conjugate pairs constructed from one-sided zeros and poles obtained from the above method. Thus the orders are twice the numbers of zeros and poles from the above procedures, respectively.

4.2 Modeling of Higher-Order Modal Decays

In this section, the performance of the FZ-ARMA analysis method is illustrated through synthetic signals. In particular we are interested in investigating the modeling capability when dealing with signals exhibiting beating and/or two-stage decay in their envelopes. Simple signals featuring these characteristics can be obtained by $$s(n) = \sum_{k=1}^{M} a_k e^{-n/\tau_k} \sin\left(2\pi n \frac{f_k}{f_s} + \theta_k\right) \quad (9)$$

where M is the number of modal frequencies present in s(n), $\tau_k$ are the decay time constants, $f_k$ the modal frequencies, $f_s$ the sampling frequency, and $\theta_k$ the initial phases of the modes.

Figure 3:
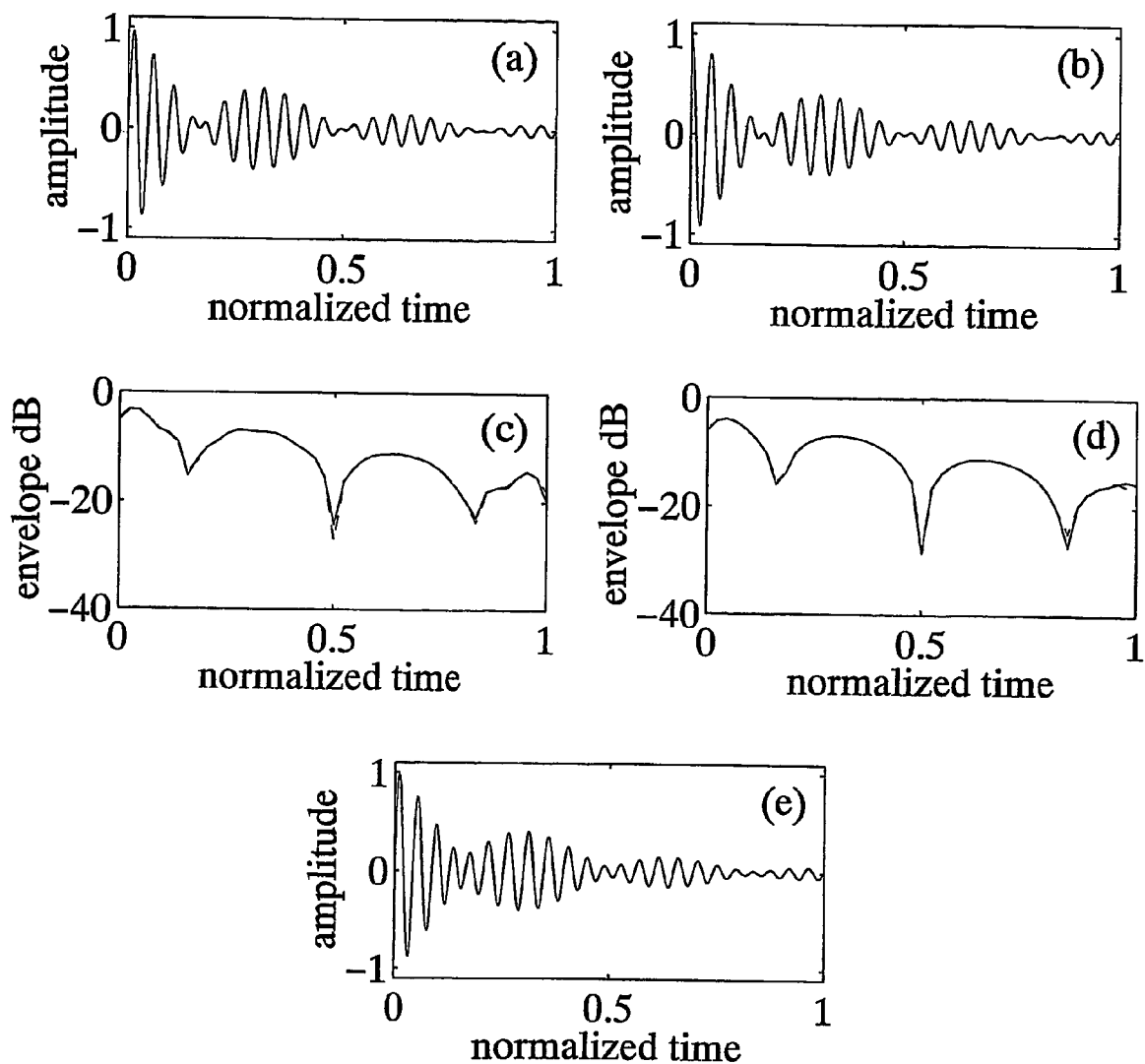
FIG. 3 shows case (A), amplitude beating due to two modes with nearby frequencies: (a) synthetic signal generated according to Eq. 9 with parameters given in Table 1; (c) original (dashed line) and modeled (solid line) amplitude envelopes (curves overlap almost perfectly); and (e) resynthesized signal based on the estimated model. Subplots (b), and (d) refer to a modified signal generated with parameters shown in Table 1 but with phases replaced by $\theta_1=\theta_2=\pi/2$.

Let us start with case (A) in which the amplitude envelope of the signal consisting of two modes shows beating. The parameters used to generate the signal as well as those adopted in the FZ-ARMA modeling are given in Table 1. The target responses in sine and cosine phase, their FZ-ARMA envelopes, and resynthesized versions are shown in FIG. 3. The envelopes are obtained from the complex decimated signals.

Each resynthesized response is computed as the impulse response of the filter that is obtained by combining the complex conjugate poles and zeros from the FZ-ARMA analysis. Notice that the band-limitation in frequency focusing produces compensating zeros (and poles) that show artifacts in the reconstructed impulse response. In a typical case of focusing on a narrow resonance band the reconstructed impulse response has a high-amplitude impulse as its first sample (see also [27]). This has been removed in the resynthesized response simulations of this patent application. This removal has only marginal effect on the spectral properties of the response.

In the simulation results of case (A) in FIG. 3, an ARMA(4,4) model suffices to represent properly the envelope decays in subplots (c) and (d), while the initial phase characteristics of the resynthesized signal in (f) deviate form (b). Note that it is almost impossible to distinguish between the dashed and solid lines in the subplots (c) and (d) of FIG. 3.

Figure 4:
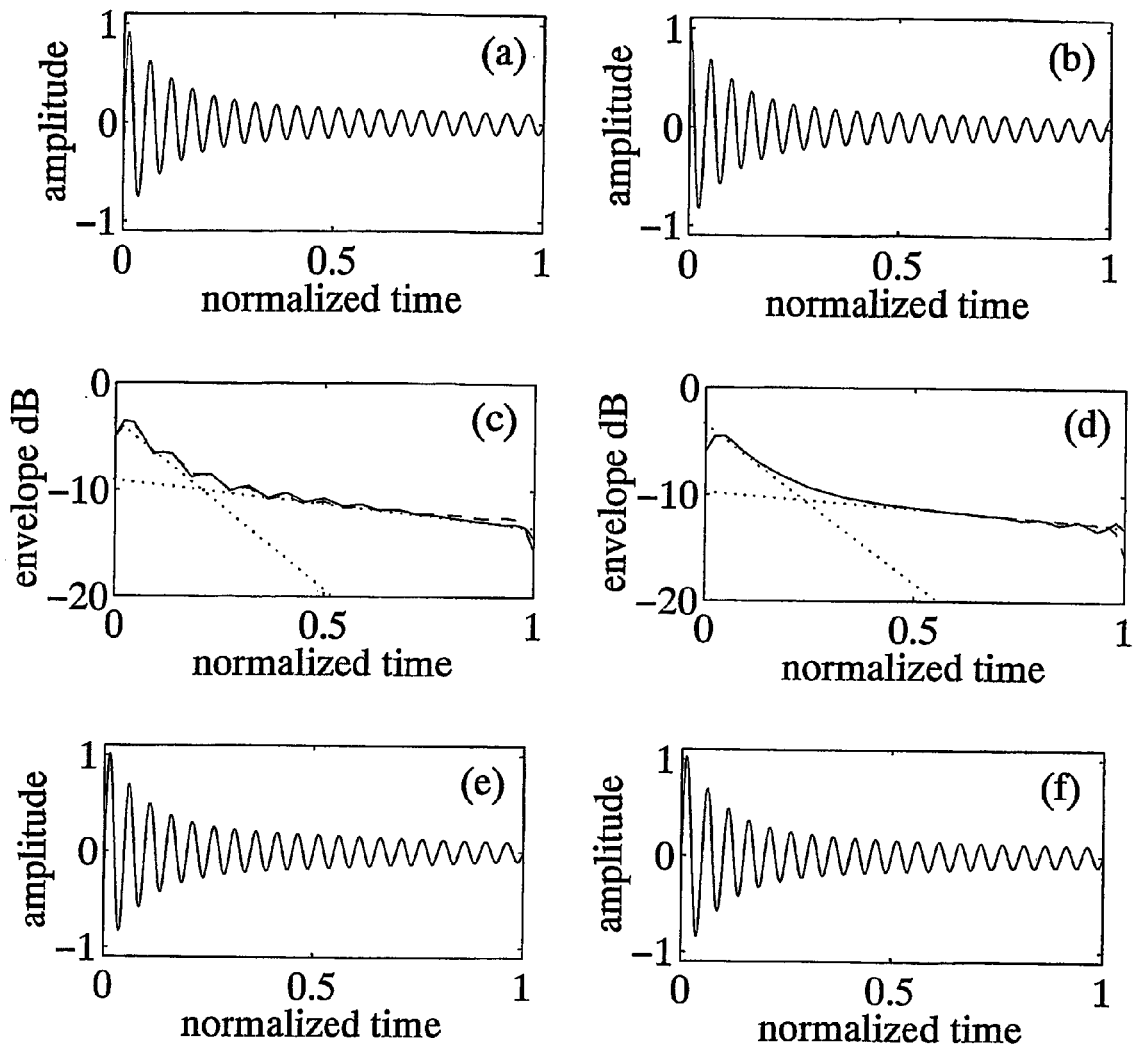
FIG. 4 shows Case (B), two-stage decay due to two modes with equal frequency: (a) synthetic signal generated according to Eq. (9) with parameters given in Table 2; (c) original (dashed line) and modeled (solid line) amplitude envelopes; and (e) resynthesized signal based on the estimated model. Subplots (b), (d), and (f) refer to another signal generated with parameters shown in Table 2 but with phases replaced by $\theta_1=\theta_2=\pi/2$.

In case (B) we verify the FZ-ARMA modeling of a two-mode response for which the amplitude envelope exhibits a two-stage decay. The parameters used to generate this signal, as well as those of FZ-ARMA modeling, are summarized in Table 2, and the results of modeling are shown in FIG. 4. The slower decaying mode is modeled properly although its initial level is 10 dB below the stronger one. This ability of two-stage decay analysis can work down to −30 dB in a clean synthetic case.

4.3 Modeling of Noisy Responses

In simulation case (C), in order to verify the FZ-ARMA modeling when dealing with noisy signals, we contaminate the impulse responses shown in the plots (a) and (b) of FIG. 3 with zero-mean additive white Gaussian noise. In this example the variance of the noise is chosen to produce a signal-to-noise ratio (SNR) of −5 dB in the beginning of the signal. Of course, the local SNR decreases towards the end of the signal.

Figure 5:
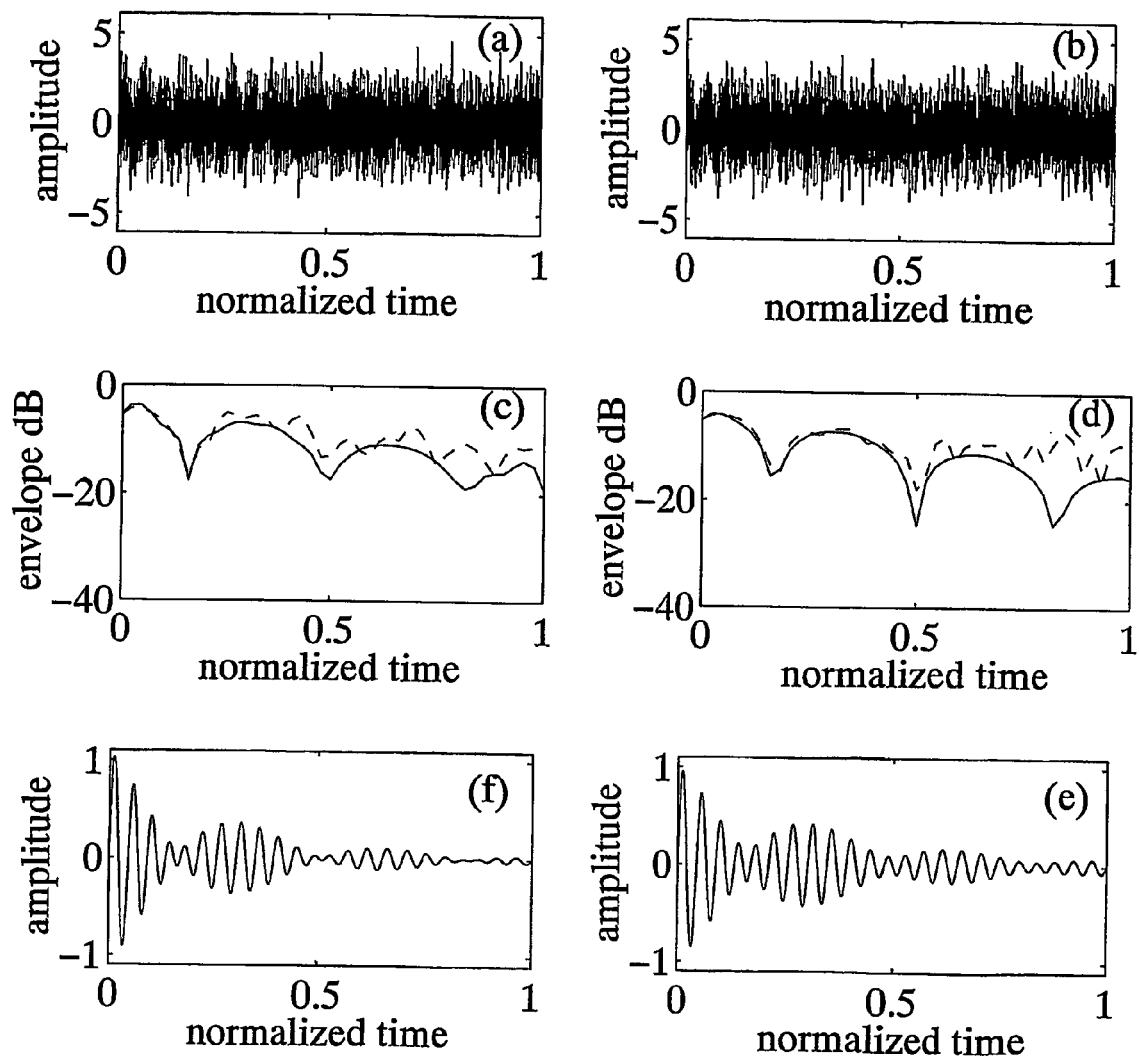
FIG. 5 shows case (C), amplitude beating of two modes in noise: (a) synthetic signal generated according to Eq. (9) with parameters given in Table 1 immersed in white noise; (c) original (dashed line) and modeled (solid line) amplitude envelopes; and (e) resynthesized signal based on the estimated model. Subplots (b), (d), and (f) refer to a modified signal generated with parameters shown in Table 1 but with phases replaced by $\theta_1=\theta_2=\pi/2$.

The results are displayed in FIG. 5, which follows the same structure as the previous figures. Now, by looking at subplots (c) and (d) of FIG. 5 it can be seen that the envelopes of the modeled signals (solid lines) differ substantially from those of the noisy signals (dashed lines). Moreover, the resynthesized signals based on the computed models, shown in subplots (e) and (f), are free of visible noise and follow closely their corresponding clean versions, which are depicted in the subplots (a) and (b) of FIG. 3.

TABLE 1

Parameters in simulation case (A).

Synthetic signal

| $f_1$/Hz | $f_2$/Hz | $a_1$ | $a_2$ | $\tau_1$ | $\tau_2$ | $\theta_1$ | $\theta_2$ |
|---|---|---|---|---|---|---|---|
| 100 | 115 | 0.5 | 0.5 | 0.07 | 0.07 | 0 | 0 |

FZ-ARMA

| $K_{zoom}$ | $f_m$/Hz | N | P |
|---|---|---|---|
| 200 | 52.37 | 4 | 4 |

TABLE 2

Parameters in simulation case (B).

Synthetic signal

| $f_1$/Hz | $f_2$/Hz | $a_1$ | $a_2$ | $\tau_1$ | $\tau_2$ | $\theta_1$ | $\theta_2$ |
|---|---|---|---|---|---|---|---|
| 100 | 100 | 0.2 | 0.8 | 0.3 | 0.02 | 0 | 0 |

FZ-ARMA

| $K_{zoom}$ | $f_m$/Hz | N | P |
|---|---|---|---|
| 200 | 44.87 | 4 | 4 |

The highly successful result of reducing the additive noise in simulation case (C) can be understood when considering the frequency zooming to a narrow band around the modal frequencies of interest, whereby SNR is improved by the zooming ratio, i.e., by $10 \log_{10} 200 = 23$ dB in this case. The low-order ARMA(4,4) modeling further reduces the influence of noise due to good correlation with the modal signals only.

4.4 Envelope Modeling of Non-LTI System

A primary assumption when applying FZ-ARMA or any LTI system modeling is that the frequencies of modes do not change within the duration of the analyzed segment. If this requirement cannot be satisfied, e.g., in strongly plucked string instrument tones having initial pitch shifting [28], the envelope behavior of the target signal can still be modeled. A straightforward way, if the frequency trajectory of the pitch shift is know, is to resample the signal so that the shift is eliminated. Another way is to apply FZ-ARMA modeling but adopting higher orders for the numerator and denominator so that this can capture the effect of frequency shift.

Figure 6:
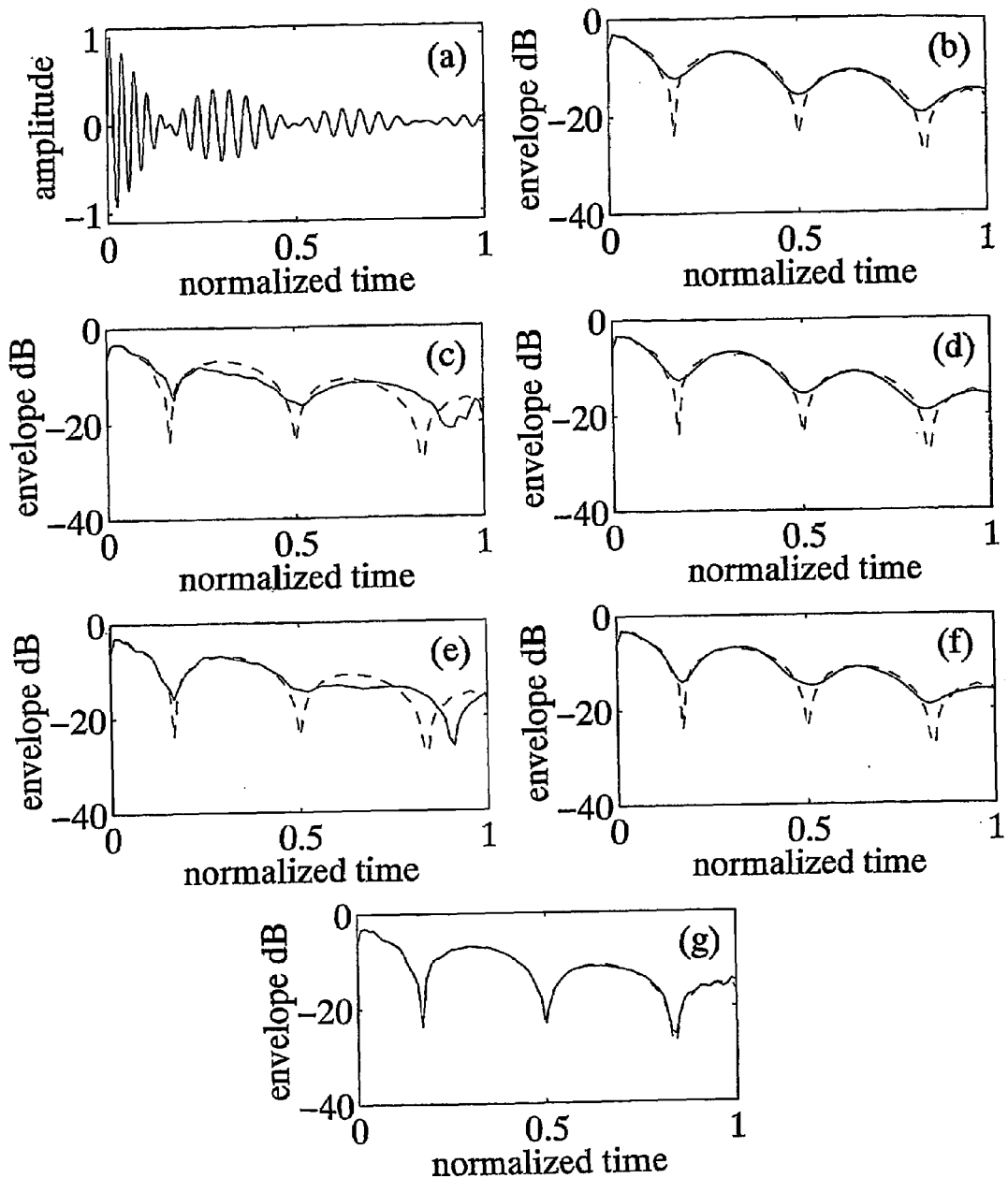
FIG. 6 shows case (D), amplitude beating with pitch-shift: (a) synthetic signal generated according to Eq. (9) with parameters given in Table 1 but with a pitch shift. The plots on the left column show the original (dashed-line) and modeled (solid-line) amplitude envelopes for the FZ-ENV-ARMA models of orders: (b) ARMA(4,4), (d) ARMA(8,8), and (f) ARMA(12,12). Subplots (c), (e), and (g) on the right column show the same cases but for the FZ-ARMA modeling with corresponding model orders.

Alternatively, one can compute an ARMA model for the envelope of a modulated and decimated signal (FZ-ENV-ARMA). In that way the envelope behavior can be approximated with a lower model order. Simulation case (D), an example that compares the standard FZ-ARMA modeling against the FZ-ENV-ARMA, is shown in FIG. 6. The test signal plotted in subplot (a) is a version of that plotted in FIG. 3, but now the frequencies of the modes start 50 Hz above the values indicated in Table 1 and then converge exponentially with a time constant of 100 ms to the nominal values. The plots on the left column show the original and modeled envelopes for different FZ-ENV-ARMA model orders. The plots on the right column do the same but employing FZ-ARMA models.

To resynthesize a changing pitch signal based on the FZ-ENV-ARMA computed model, it is necessary to estimate its pitch behavior. Then, after obtaining a model for the amplitude envelope, a frequency modulation corresponding to the original frequency shift should be employed during synthesis. For a direct FZ-ARMA modeling this is not needed if the estimation is capable of capturing the given behavior of the shifting modal frequencies.

It can be verified from FIG. 6 that, in constrast to what happens to the FZ-ARMA modeling, increasing the model order in the FZ-ENV-ARMA does not essentially help to improve the model fit, since the inherent phase relations of the original signal have been lost in the computation of the envelope that is used as a target. Nevertheless, for low-order modeling, FZ-ENV-ARMA yields better envelope fit than the equal order FZ-ARMA modeling.

Figure 7:
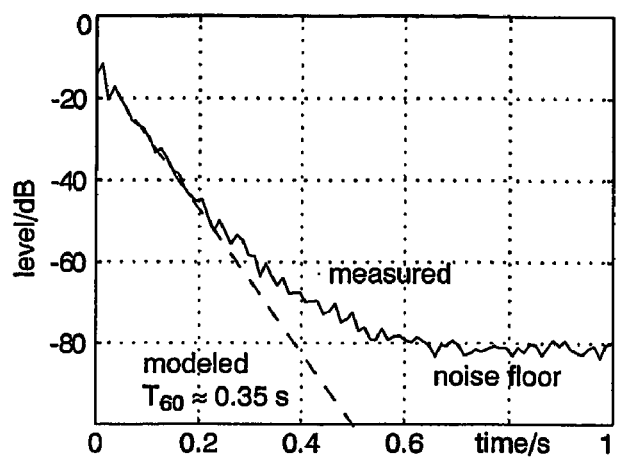
FIG. 7 shows case (E), estimation of reverberant response decay rate and $T_{60}$ by modeling the decay envelope using low-order FZ-ENV-ARMA model. Measured response was bandpass filtered (1-2 kHz), absolute value of Hilbert envelope taken and decimated by 500, modeled by filter orders N=6, P=6, and finally the largest positive (real) pole corresponding to the main decay component was identified for slope estimation.

If the response of a target system is highly complex in mode density, such as a room response at medium to high frequencies, a detailed modal description may not be feasible or even desired. In such cases the envelope behavior can be represented simply by fitting a lower order model to the decaying envelope in a desired frequency range by FZ-ENV-ARMA techniques. This can be useful in decay time estimation. There exist many methods, however, that are better motivated for example in reverberation time $RT_{60}$ estimation [13]. Simulation case (E) in FIG. 7 depicts the decay envelope of an example room response for the octave band 1-2 kHz and a related envelope curve fitting by low-order FZ-ARMA modeling.

Another form of non-LTI behavior are nonlinearities. A small degree of nonlinearity in a system can be accepted, and even quite severe deviation from linear can be tolerated if we accept the fact that the parameters are then signal-dependent, for example dependent on the level of a signal.

4.5 Selection of Zooming Parameters

The choice of the FZ-ARMA parameters, i.e., $\Omega_m$, $K_{zoom}$, and the ARMA orders N and P, depends on several factors. Considering first the zoom factor, it can be said that the larger $K_{zoom}$ is, the higher the frequency resolution. This favors cases in which the modes are densely distributed in frequency. On the other hand, high values for $K_{zoom}$ imply a more demanding signal decimation procedure and less samples available for modeling in the decimated signal.

A possible strategy is to define a minimum $f_{s,zoom}$ beforehand and then derive $K_{zoom}$. For instance, the criterion may be based on the number of samples that remain in the decimated signal. Another natural choice when there are relatively isolated modes or mode groups is to select the frequency range of focusing to cover such a group and its vicinity until neighboring modes or groups start to have influence. It is recommended to to choose the range of focus such that resonance peaks are not placed at the ends of the subband. As a rule of thumb, a suitable choice is to set $f_m = f_r - f_{s,zoom}/4$, which brings the resonance frequency $f_r$ in the middlepoint of the decimated frequency range.

The order of an ARMA model will be dependent on the number of modes associated with each resonance group. Experiments on two-mode resonances reveal that adopting an ARMA(4,4) model in general yields satisfactory results for such cases. Better modeling accuracy can be achieved by increasing the order, although the result may not be physically interpretable for a two-mode case. High-order analysis also rises the probability of ending up with an unstable model.

Note that in FZ-ARMA the modulation frequency $f_m$ must correspond to the lower edge of the focusing range and the zooming factor $K_{zoom}$, in relation to sampling rate, determines the zooming bandwith.

5 Case Studies in Audio Applications

AR/ARMA modeling has many applications in modern audio signal processing. Linear and time-invariant models can be applied for example in room acoustics, sound synthesis, and audio reproduction. Based on the previous theoretical overview and examples, in this section we will take examples from these domains to study the feasibility of the methods, particularly of the FZ-ARMA technique, in several audio applications.

5.1 Modeling of Room Impulse Responses

A challenging application for AR/ARMA modeling is to find compact but perceptually valid approximations for measured (or computed) room impulse responses [12]. This is needed for example in modal analysis of rooms at low frequencies, artificial reverb designs, or equalization of loudspeaker-room responses.

Figure 8:
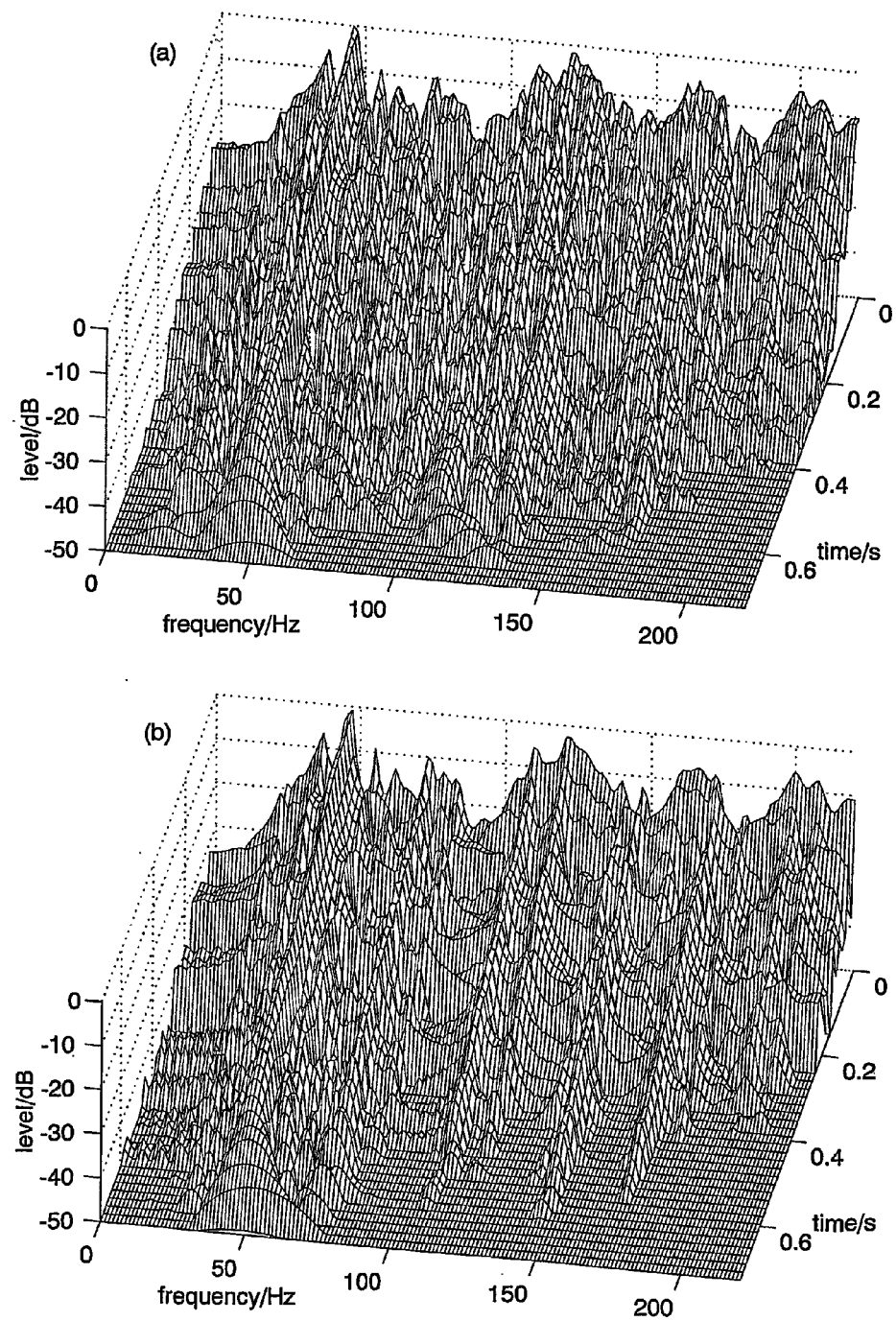
FIG. 8 shows case (F): (a) cumulative decay spectrum of a measured room response below 220 Hz, for time span 0.0 . . . 1.0 s; (b) cumulative decay spectrum computed from the impulse response of an AR model (P=80) for the room response of FIG. 8(a). The original sampling rate 44100 Hz was decimated to 400 Hz before AR modeling. Level is limited to −50 dB.

As case study (F), an analysis of low-frequency modal behavior of a room impulse response is carried out using different AR and FZ-ARMA methods. The room has approximate dimensions of 5.5×6.5×2.7 $m^3$. FIG. 8(*a*) describes the time-frequency behavior (cumulative decay spectrum) for frequencies below 220 Hz as computed from a measured room impulse response. The room shows particularly intense and long modal decays around 45 Hz.

A straightforward AR modeling of the room impulse response below 220 Hz using linear prediction yields fairly accurate results when the all-pole filter order P is about 100 or above for the low-frequency range. FIG. 8(*b*) shows the model response decay plot when P=80. The original sample rate of 44100 Hz was decimated by a factor of 110 before AR modeling. A comparison with FIG. 8(*a*) reveals that the decay times of prominent modes are quite well modeled but many weaker modes are too short or too damped due to insufficient model order.

Direct ARMA modeling by Steiglitz-McBride method yields a better time domain fit with a given denominator order than the corresponding AR model. For example using numerator order of N=30 and denominator P=100 worked fairly well for the room response above, although in many cases the Steiglitz-McBride algorithm gives an unstable result already with such moderate filter orders.

Figure 9:
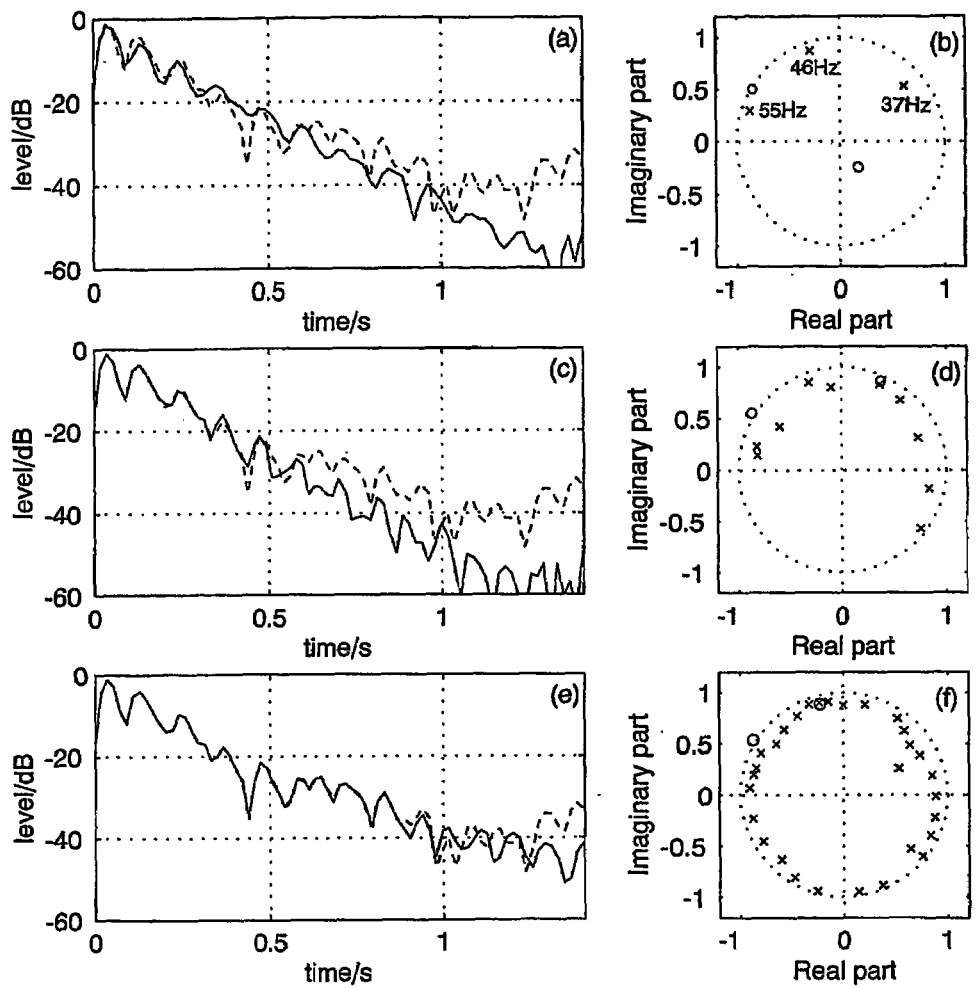
FIG. 9 shows case (G), envelope match for the decay of modal group between 33 and 58 Hz in the room response of FIG. 8 with different FZ-ARMA orders: (a) ARMA(4,6), (c) ARMA(4,20), (e)ARMA(6,60). Solid line=modeled, dotted line=original. Poles (x) and zeros (o) in the decimated z-domain are plotted in (b), (d), and (f), respectively. (Some zeros fall outside the plotting range.)

FZ-ARMA is a powerful method for accurate modeling of modal behavior in a limited frequency range. FIG. 9 depicts modeling results of the prominent modal region 33 . . . 58 Hz in the response of FIG. 8(*a*). The region includes three major modes at frequencies of 37, 46, and 55 Hz. FIG. 9 shows the decay envelope of the modal region for the original signal (dashed line) and as a result of applying the Steiglitz-McBride method of different orders (solid line). Increasing the filter order improves the envelope fit, but finally it may start to model the background noise envelope. The pole-zero plots on the right hand side indicate that for an order of P=6 the poles correspond to the three modes, while for higher orders there are extra poles and it is not easy to associate them with the modes.

Figure 10:
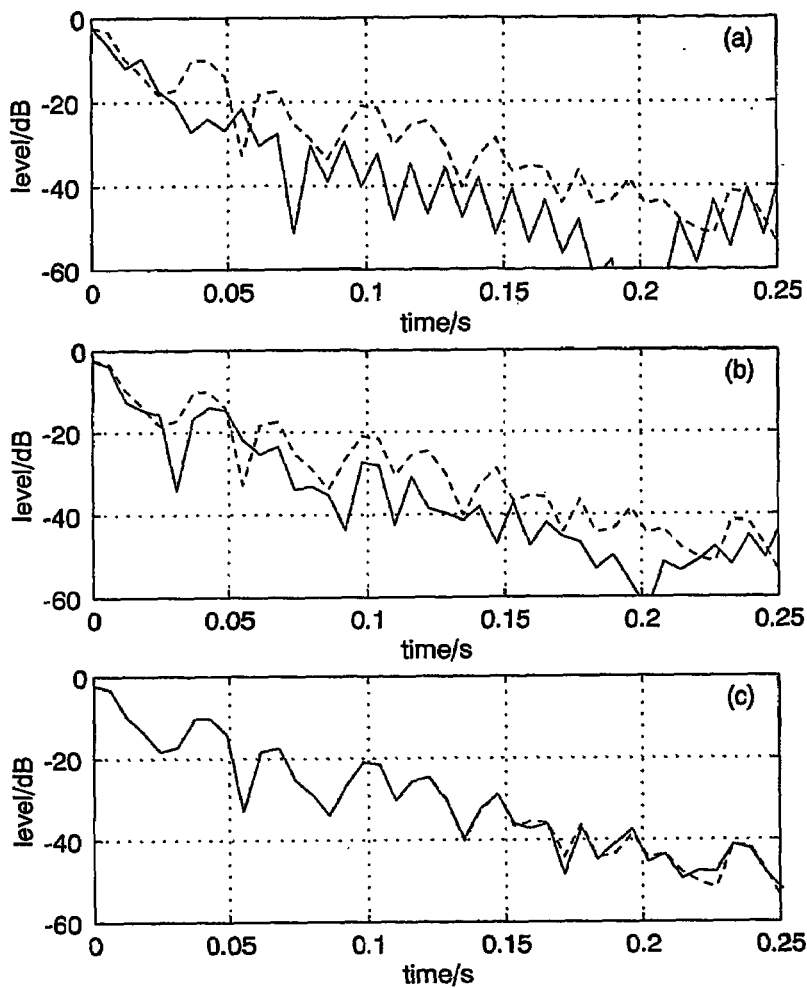
FIG. 10 shows case (H), fitting to room response within critical band 920 . . . 1080 Hz by FZ-ARMA of orders (a) ARMA(6,6), (b) ARMA(6,20), (c) ARMA(6,60), described by amplitude envelopes of original (dashed line) and modeled (solid line) responses.

At higher frequencies, above the critical frequency (Schroeder frequency) [29] of the room, the modal behavior is diffuse, i.e., the modal density is high and modes overlap in frequency. Full audio range AR and ARMA modeling is difficult, if not impossible. However, it is possible to apply the FZ-ARMA analysis to a narrow frequency band of a reverberant response. FIG. 10 describes a fitting to the room response studied within a critical band at 1 kHz (920 . . . 1080 Hz) by different model orders. With the highest model order P=60, envelope fitting is good for the first 250 ms and for about a 40 dB dynamic range.

5.2 Loudspeaker/Room Equalization

Equalization of a loudspeaker response or a loudspeaker-room reproduction chain means correcting the system response closer to desired perceptual or technical criteria. MA and ARMA modeling have been reported in the literature in several forms for loudspeaker and in-situ frequency response equalization, both in on-line and off-line formulations [30, 31, 32, 33, 34, 35, 36, 37, 38, 39, 17, 40, 41, 42, 43, 23]

Equalization of the free-field magnitude response (possibly including the phase response) of a loudspeaker by DSP can be carried out using many known techniques. For highest quality loudspeakers there is hardly any need to improve its free-field response, but the loudspeaker-room combination may benefit greatly from proper equalization.

The combined task of loudspeaker and room equalization is also demanding since it is essentially a problem of finding a perceptually optimal time-frequency equalization, instead of simple flattening of the magnitude spectrum and/or linearization of phase. There seems to be quite a common misunderstanding that just flattening the response, at least at low frequencies where it might be technically possible, would be an ideal solution. A better strategy is to improve the balance of overall acoustical parameters, particularly of the reverberation time. As discussed in [44], this can be done by controlling the decay times of individual modes at low frequencies, typically below 200 Hz, to match the reverberation time at mid frequencies. This is called modal equalization. It may be followed by a traditional correction of the envelope of magnitude response. The need for such active correction of room acoustics is particularly prominent around 100 Hz even in spaces designed for listening purposes, such as audio monitoring rooms [45].

In [44] we proposed a method for modal equalization. In the present patent application we suggest another technique to realize modal equalization, optionally combined with magnitude envelope correction. The general framework of modal equalization has been discussed in detail in the previous paper. A brief description of the procedure is:

1. Measure the combined loudspeaker plus room impulse response in the listening position of interest. Any modern technique for reliable response measurement can be applied.

2. Analyze the average reverberation time $RT_{60}$ at mid frequencies, for example between 500 Hz . . . 2 kHz.

3. Determine an upper limit of modal decay time as a function of frequency for the low-frequency range, typically below 200 Hz. This value can be allowed to grow slightly toward lowest frequencies [46, 47], for example linearly by 0.2 s when the frequency decreases from 300 Hz to 50 Hz.

4. Find the modes that need equalization, i.e., those that have a longer decay time than the upper limit defined above. If the magnitude level of a mode is so low that its tail remains below a given level, it does not need modal equalization even when its decay time is longer than the upper limit. Estimate modal parameter values for these modes, particularly the modal frequency and the decay time constant, and compute the angles and radii of the corresponding poles.

5. Design a correction filter for each mode requiring equalization so that the filter shortens the decay time to meet the upper limit criteria specified in step 3. This means canceling the estimated pole pair, which represents a mode with a long decay time, by a zero pair, and replacing it with a new pole pair having the desired decay time. This can be done with an IIR filter [44]

$$H_c(z) = \frac{(1 - re^{j\theta}z^{-1})(1 - re^{-j\theta}z^{-1})}{(1 - r_c e^{j\theta_c}z^{-1})(1 - r_c e^{-j\theta_c}z^{-1})} \quad (10)$$

where r and $r_c$ are the (complex conjugate) pole radii of the original decay and the corrected decay, respectively, and $\theta$ and $\theta_c$ are the corresponding pole angles.

6. Compute steps 4 and 5 either in a batch mode, i.e., in parallel for each mode to be equalized, or iteratively so that modes are equalized one by one, starting from the most prominent one and returning to step 4, to be applied to the result of the previous equalization. The process is terminated when all remaining modes meet the decay time criteria or when a preset upper limit of correctable modes has been reached.

7. Traditional magnitude equalization can be applied to the result of modal equalization, if needed, by any method or technique appropriate.

In this context we are only interested in step 4 as a part of batch or iterative analysis. All other steps follow the general scheme described in [44], where the mode search and the decay time estimation were based on a time-frequency representation and fitting of a logarithmic decay plus background noise model using nonlinear optimization. While the previously proposed method is found robust for modes that are separated well enough, strongly overlapping or multiple modes with closely similar frequency are an inherent difficulty of that method. Since AR/ARMA models search for a global optimum and don't try to separate modes, they are potentially a better alternative in such cases.

In the equalization cases below, mode finding and parameter estimation are carried out iteratively in the following way:

1. Compute a function that can be used robustly to find the most prominent modes and their frequencies. This can be done in different ways, for example directly by AR or ARMA analysis and finding the poles with largest radii. Because the selection of proper model order can be problematic, we have first applied here a separate mode detection function $$G(\Omega) = \sqrt{|H(\Omega)|\max(0, D(arg(H(\Omega))))} \quad (11)$$

where $H(\Omega)$ is the Fourier transform of the measured response, $\Omega$ is the normalized angular frequency (angle in the z-plane), and D is a differentiation operator (in the frequency domain). An example of $G(\Omega)$ function is plotted in FIG. 11(d). Positive peaks indicate strong modes that may need decay time equalization. Note that this function combines both the magnitude level and the decay time (through phase derivative) information. This is one possible detection function, and there can be other functions for this purpose.

2. Find the highest peak position $\Omega_p$ of the detection function $G(\Omega)$ as the best candidate for modal equalization. Run AR analysis of predefined order (here we applied orders 50 . . . 70 for the frequency range below 220 Hz) on the minimum phase version of the target response to find poles and select the pole closest to the point $e^{j\Omega_p}$ on the unit circle. This pole and its complex conjugate now represent the most prominent mode.

3. If the decay time of the mode is below the upper limit allowed and the value of $G(\Omega_p)$ is below a threshold experimentally determined, go to finalize the process in step 4. If not, design a second-order modal correction filter of type Eq. (10) to change the modal decay time to a desired value below the upper limit. Apply this to the response to be equalized and use the result when going back to iterate from step 1.

4. Finally, collect the correction filters into a cascaded filter which is now the modal equalizer for the system.

Figure 11:
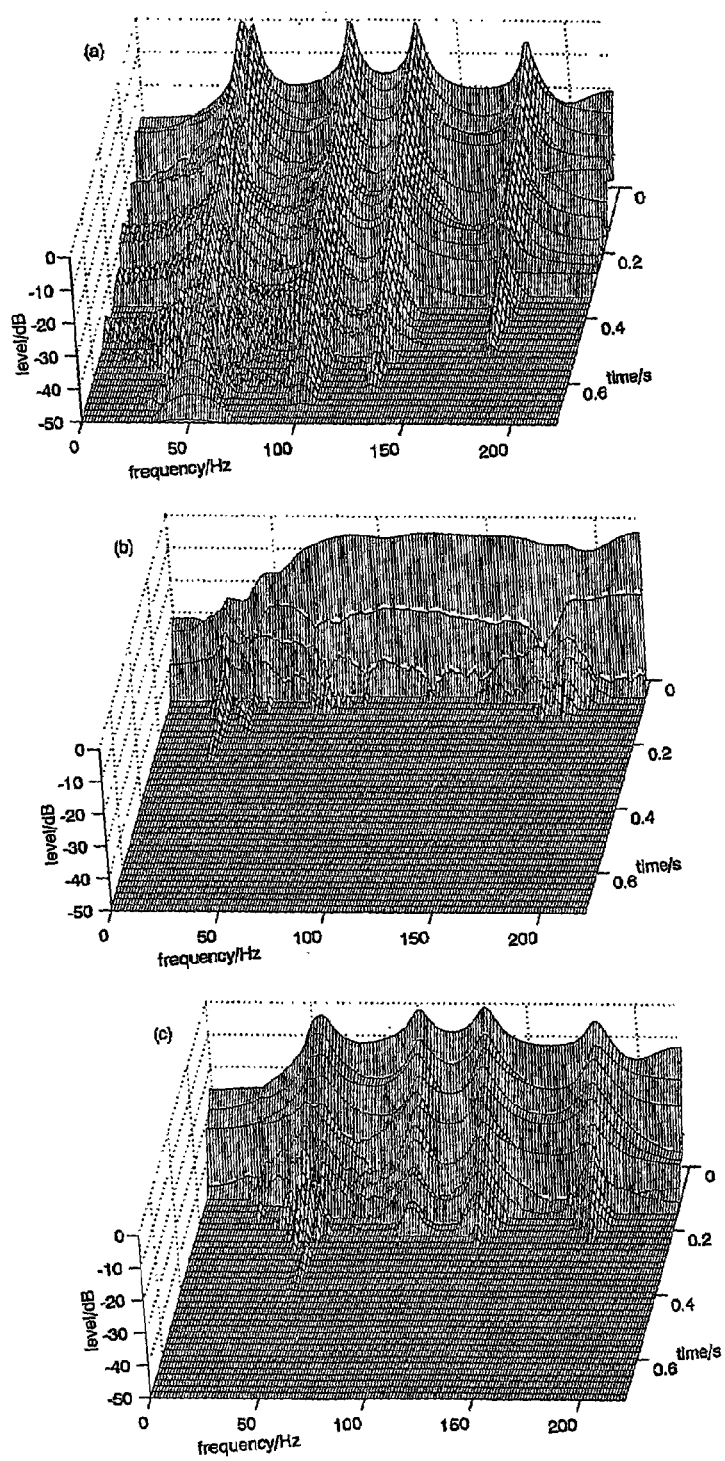
FIG. 11 shows case (I), cumulative decay spectra for equalization of loudspeaker plus synthetic modes: (a) original response plus five modes at frequencies 50, 55, 100, 130, and 180 Hz, (b) modes fully damped, (c) modal decay time (60 dB) equalized to 250 ms, and (d) mode detection function $G(\Omega)$ for the original response. Decay levels are limited to −50 dB.
Figure 12:
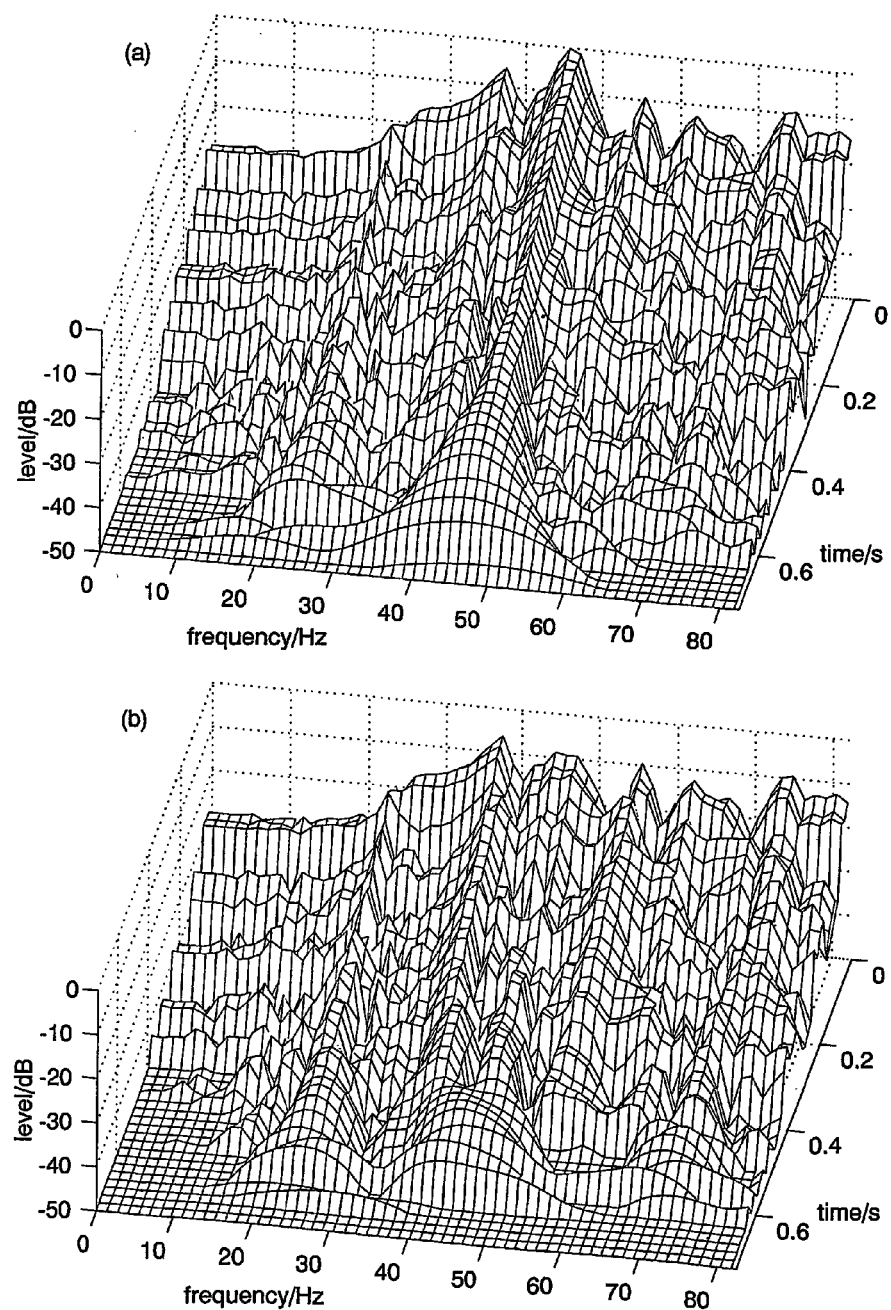
FIG. 12 shows Case (J), equalization of a single mode at 46 Hz of the room analyzed in FIG. 8: (a) original response, (b) after mode equalization.

A simulated modal equalization, case (I), is illustrated in FIG. 11. A loudspeaker impulse response is filtered to add five simulated modes at frequencies 50, 55, 100, 130, and 180 Hz, with 60 dB modal decay times of 1.4, 0.8, 1.0, 0.8, and 0.7 seconds, respectively. The cumulative decay spectrum of this synthetic response is shown in FIG. 11(a). FIG. 11(b) proves that the effect of the modes can be cancelled out almost perfectly, leaving the loudspeaker response only, by moving the pole radii to correspond to a very short decay time (about 60 ms) using the procedure described above. In FIG. 11(c) the result of modal equalization depicted is more appropriate for real room conditions. The decay time of each mode is equalized to 250 ms. The two nearby modes partly overlapping, at 50 and 55 Hz, do not cause any difficulties, and the modal equalization works almost perfectly. In case (J) of FIG. 12 the most prominent single mode at 46 Hz is equalized by shortening the decay time from a value above 1 second to about 300 ms using the algorithm described above and limiting the search for modes to only one. In FIG. 12(b) the originally problematic mode decays now clearly faster. Furthermore, the equalized response up to 80 Hz has much smoother shape since the modal equalization also affects the magnitude spectrum. However, the decay times of some other modes remain long.

Figure 13:
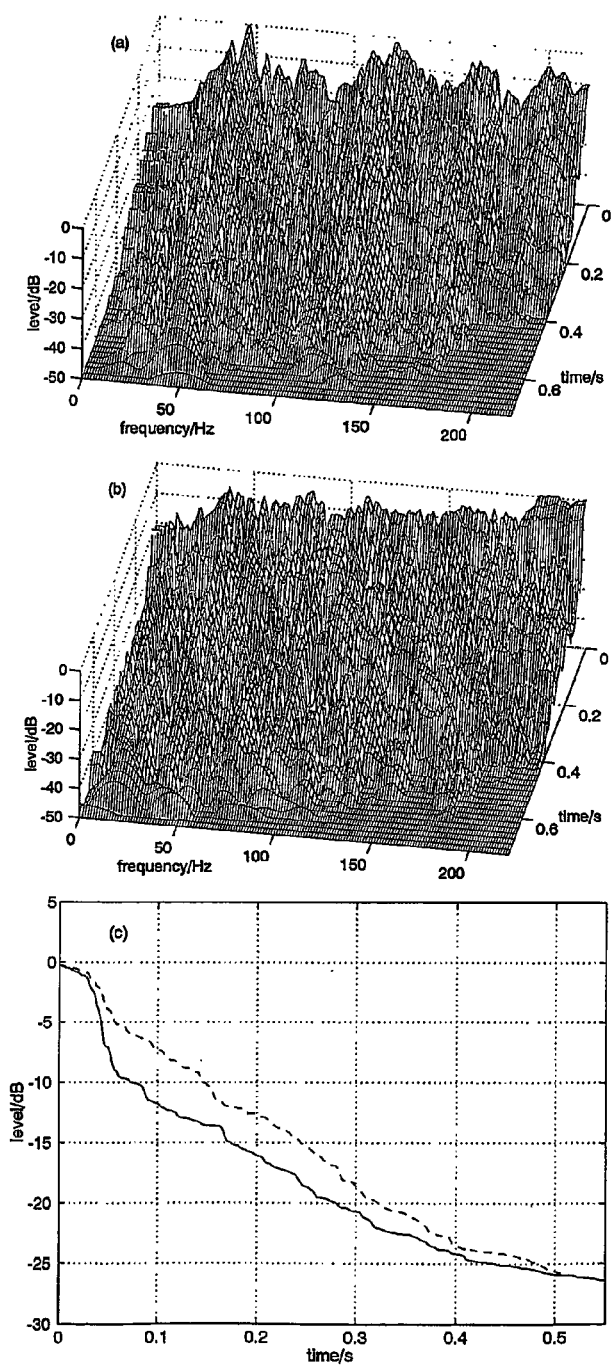
FIG. 13 shows Case (K), equalization of the room response analyzed in FIG. 8: (a) original response, (b) after mode equalization, and (c) backward integrated energy decay for the original (dashed line) and equalized (solid line) responses.

Multi-mode equalization of the same room, case (K), is shown in FIG. 13. The room is the same as the one analyzed in case (F), FIG. 8. The procedure described above is iterated 100 times, yelding 100 second-order correction filter sections, to shorten the mode decay times. The cumulative decay spectrum of the resulting equalized response is illustrated in FIG. 13(b). The target value for equalized modal decay time (60 dB) has been 150 ms.

In this case the result is not as perfect as in the synthetic or single mode case. There is about 10 dB of fast decay in the beginning, as shown by backward integrated plots in FIG. 13(c), and thereafter the decay rate follows the original one. Although the ideal shortening of the decay time is not achieved precisely, it already makes sound reproduction in the room more balanced in the terms of reverberation. Furthermore, the equalization procedure can be improved by careful adjustment of the details.

The final step, i.e., smooth envelope equalization of the magnitude response, is not discussed here since many known techniques could be applied to equalize the magnitude response. An interesting choice is, however, to integrate the magnitude equalization phase together with the AR/ARMA modal equalization process.

Figure 14A:
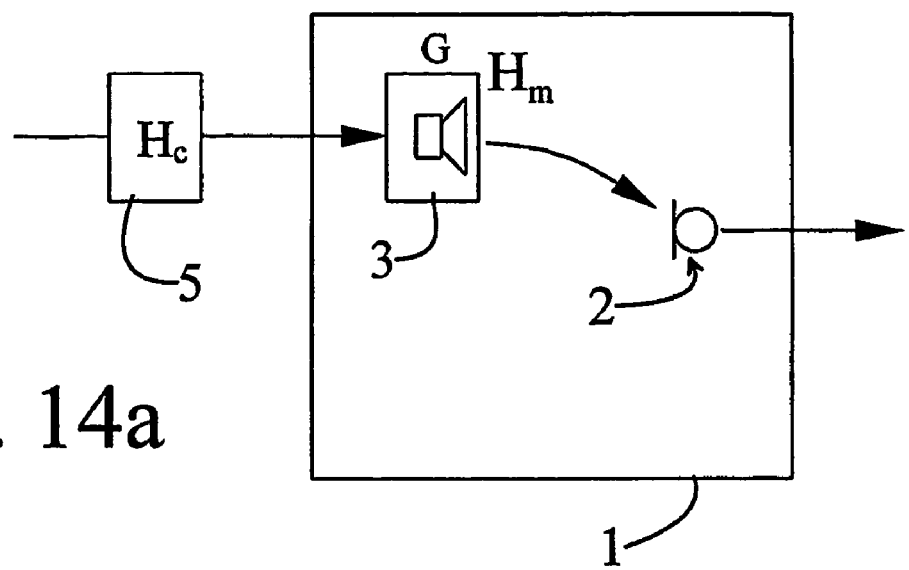
FIG. 14a shows a block diagram of type I modal equalizer in accordance with the invention using the primary sound source.

In accordance with FIG. 14a in one typical implementation of the invention the system comprises a listening room 1, which is rather small in relation to the wavelengths to be modified. Typically the room 1 is a monitoring room close to a recording studio. Typical dimensions for this kind of a room are 6×6×3 m³(width×length×height). In other words the present invention is most suitable for small rooms. It is not very effective in churches and concert halls. The aim of the invention is to design an equalizer 5 for compensating resonance modes in vicinity of a predefined listening position 2.

Type I implementation modifies the audio signal fed into the primary loudspeaker 3 to compensate for room modes. The total transfer function from the primary radiator to the listening position represented in z-domain is $$H(z) = G(z)H_m(z) \quad (12)$$

where G(z) is the transfer function of the primary radiator from the electrical input to acoustical output and $H_m(z)=B(z)/A(z)$ is the transfer function of the path from the primary radiator to the listening position. The primary radiator has essentially flat magnitude response and small delay in our frequency band of interest, or the primary radiator can be equalized by conventional means and can therefore be neglected in the following discussion, $$G(z) = 1 \quad (13)$$

We now design a pole-zero filter $H_c(z)$ having zero pairs at the identified pole locations of the modal resonances in $H_m(z)$. This cancels out existing room 1 response pole pairs in A(z) replacing them with new pole pairs A'(z) producing the desired decay time in the modified transfer function H'm(z)

$$H'_m(z) = H_c(z)H_m(z) = \frac{A(z)}{A'(z)}\frac{B(z)}{A(z)} = \frac{B(z)}{A'(z)} \quad (14)$$

This leads to a correcting filter $$H_c(z) = \frac{A(z)}{A'(z)} \quad (15)$$

The new pole pair A'(z) is chosen on the same resonant frequency but closer to the origin, thereby effecting a resonance with a decreased Q value. In this way the modal resonance poles have been moved toward the origin, and the Q value of the mode has been decreased. The sensitivity of this approach will be discussed later with example designs.

Type II Modal Equalization

Figure 14B:
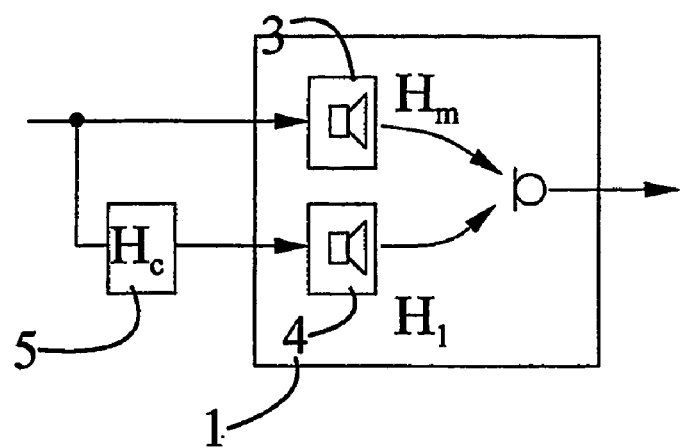
FIG. 14b shows a block diagram of type II modal equalizer in accordance with the invention using a secondary radiator.

In accordance with FIG. 14b, type II method uses a secondary loudspeaker 4 at appropriate position in the room 1 to radiate sound that interacts with the sound field produced by the primary speakers 3. Both speakers 1 and 4 are assumed to be similar in the following treatment, but this is not required for practical implementations. The transfer function for the primary radiator 3 is $H_m(z)$ and for the secondary radiator 4 $H_1(z)$. The acoustical summation in the room produces a modified frequency response $H'_m(z)$ with the desired decay characteristics $$H'_m(z) = \frac{B(z)}{A'(z)} = H_m(z) + H_c H_1(z) \quad (16)$$

This leads to a correcting filter $H_c(z)$ where $H_m(z)$ and $H'_m(z)$ differ by modified pole radii $$H_c(z) = \frac{H'_m(z) - H_m(z)}{H_1(z)} \quad (17)$$

-continued $$= \frac{A_1(z)}{B_1(z)}\frac{B(z)}{A(z)}\frac{A(z) - A'(z)}{A'(z)} \text{ and}$$

$$H_1(z) = \frac{B_1(z)}{A_1(z)} \quad (18)$$

Note that if the primary and secondary radiators are the same source, Equation 16 reduces into a parallel formulation of a cascaded correction filter equivalent to the Type I method presented above $$H'_m(z) = H_m(z)(1 + H_c(z)) \quad (19)$$

A necessary but not sufficient condition for a solution to exist is that the secondary radiator can produce sound level at the listening location in frequencies where the primary radiator can, within the frequency band of interest $$|H_1(f)| \neq 0, \text{ for } |H_m(f)| \neq 0 \quad (20)$$

At low frequencies where the size of a radiator becomes small relative to the wavelength it is possible for a radiator to be located such that there is a frequency where the radiator does not couple well into the room. At such frequencies the condition of Equation 20 may not be fulfilled, and a secondary radiator placed in such location will not be able to affect modal equalization at that frequency. Because of this it may be advantageous to have multiple secondary radiators in the room. In the case of multiple secondary radiators, Equation 16 is modified into form $$H'_m(z) = H_m(z) + \sum_N H_{c,n}(z)H_{l,n}(z) \quad (21)$$

where N is the number of secondary radiators.

After the decay times of individual modes have been equalized in this way, the magnitude response of the resulting system may be corrected to achieve flat overall response. This correction can be implemented with any of the magnitude response equalization methods.

In this patent application we will discuss identification and parametrization of modes and review some case examples of applying the proposed modal equalization to various synthetic and real rooms, mainly using the first modal equalization method proposed above. The use of one or more secondary radiators will be left to future study.

6 CONCLUSIONS

In this patent application we have studied the modeling of acoustic and audio system responses that exhibit resonant and reverberant properties. Particularly the AR and ARMA modeling techniques are investigated to obtain efficient all-pole or pole-zero filters. Such modeling, if accurate enough and computationally inexpensive, finds applications in solving many audio-oriented problems.

The first part of the patent application is a non-theoretical overview of AR and ARMA modeling methods to demonstrate their inherent properties and limitations.

A specific interest of this study has been the modeling methods that can yield good temporal match to a given target response and high frequency resolution, often at the same time. Based on earlier studies, primarily on applying Prony's method to subbands, we show that frequency-zooming ARMA (FZ-ARMA) based on the Steiglitz-McBride iteration is a powerful technique for high-resolution modeling in subbands. Simulation examples demonstrate the ability of this approach to model complex modal and reverberant behaviors.

7 REFERENCES

[1] A. D. Pierce, Acoustics, An Introduction to Its Physical Principles and Applications. Woodbury, N.Y.: Acoustical Society of America, 1989.

[2] N. H. Fletcher and, T. D. Rossing, The Physics of Musical Instnruments. New York: Springer Verlag, 1991.

[3] M. Colloms, High Performance Loudspeakers. 5th Edition. New York: Wiley, 1997.

[4] S. M. Kay, Fundamentals of Statistical Signal Processing: Volume I: Estimation Theory. Englewood Cliffs, N.J.: Prentice-Hall, 1993.

[5] A V. Oppenheim, A. Willsky, and I. Young, Signals and Systems. Englewood Cliffs, N.J.: Prentice-Hall, 1983.

[6] S. Haykin, Adaptive Filter Theory. Upper Saddle River, N.J.: Prentice Hall, 1996.

[7] M. H. Hayes, Statistical Digital Signal Processing and Modeling. Upper Saddle River, N.J.: Prentice Hall, 1996.

[8] MathWorks, Inc., MATLAB Signal Processing Toolbox, User's Guide, 2001.

[9] MathWorks, Inc., MATLAB System Identification Toolbox, User's Guide, 2001.

[10] L. B. Jackson, Digital Filters and Signal Processing. Boston: Kluwer Academic Publ., 1989.

[11] K Steiglitz, A Digital Signal Processing Primer. Menlo Park: Addison-Wesley, 1996.

[12] Y. Haneda, S. Makino, and Y. Kaneda, "Common Acoustical Pole and Zero Modeling of Room Transfer Functions," IEEE Trans. Speech and Audio Processing, vol. 2, no. 2, pp. 320-328, 1992 April.

[13] M. Karjalainen, P. Antsalo, A. Mäkivirta, T. Peltonen, and V. Välimäki, "Estimation of Modal Decay Parameters from Noisy Response Measurements," in Preprint 5290 AES 110th Convention, (Amsterdam, The Netherlands), 2001 May.

[14] J. D. Bunton and R. H. Small, "Cumulative Spectra, Tone Bursts and Applications," J. Audio Eng. Soc., vol. 30, no. 6, pp. 386-395, 1982 June.

[15] J. Makhoul, "Spectral Linear Prediction: Properties and Applications," IEEE Trans. ASSP, vol. 23, no. 5, pp. 283-296, 1975.

[16] J. Laroche, "A New Analysis/Synthesis System of Musical Signals Using Prony's Method—Application to Heavily Damped Percussive Sounds," in Proc. IEEE Int. Conf. Acoustics, Speech, and Signal Processing, pp. 2053-2056, vol. 3, 1989.

[17] J. Valakas, M. Paraskevas, and J. Mourjopoulos, "Pole-Zero Loudspeaker Response Analysis by Bandsplitting and Prony Modeling," in Preprint 4214, AES 100th Convention, (Copenhagen), 1996 May.

[18] J. D. Markel and J. H. G. Gray, Linear Prediction of Speech Signals. Berlin: Springer Verlag, 1976.

[19] L. R. Rabiner and R. W. Schafer, Digital Processing of Speech Signals. Englewood Cliffs, N.J.: Prentice-Hall, Inc., 1978.

[20] T. W. Parks and C. S. Burrus, Digital Filter Design. New York: John Wiley & Sons, Inc., 1987.

[21] L. Ljung, System Identification—Theory for the User. Upper Saddle River, N.J.: Prentice-Hall, 1999.

[22] A. Härmä, M. Karjalainen, L. Savioja, V. Välimäki, U. K. Laine, and J. Huopaniemi, "Frequency-Warped Signal Processing for Audio Applications," J. Audio Eng. Soc., vol. 48, no. 11, pp. 1011-1031, 2000 November.

[23] T. Paatero and M. Karjalainen, "Kautz Filters and Generalized Frequency Resolution—Theory and Audio Applications," in Preprint 5378 AES 110th Convention, (Amsterdam, The Netherlands), 2001 May.

[24] L. W. P. Biscainho, P. S. Diniz, and P. A. A. Esquef, "ARMA Processes in Sub-Bands With Application to Audio Restoration," in Proc. IEEE Int. Symp. Circ. Syst. (ISCAS 2001), (Sydney, Australia), pp. 157-160, vol. 2, 2001 May.

[25] J. A. Moorer, "Signal Processing Aspects of Computer Music: A Survey," Proc. IEEE, vol. 65, pp. 1108-1137, 1977 August.

[26] V. Välimäki and T. Tolonen, "Development and Calibration of a Guitar Synthesizer," J. Audio Eng. Soc., vol. 46, no. 9, pp. 766-778, September 1998.

[27] M. W. Macon, A. McCree, W.-M. Lai, and V. Viswanathan, "Efficient Analysis/Synthesis of Percussion Musical Instrument Sounds Using an All-Pole Model," in Proc. IEEE Int. Conf. Acoust. Speech and Signal Processing, pp. 3589-3592, vol. 6, 1998.

[28] T. Tolonen, V. Välimäki, and M. Karjalainen, "Modeling of Tension Modulation Nonlinearity in Plucked Strings," IEEE Trans. Speech and Audio Processing, vol. 8, no. 3, pp. 300-310, 2000, May.

[29] M. R Schroeder, "Statistical Parameters of the Frequency Response Curves of Large Rooms," J. Audio Eng. Soc., vol. 35, no. 5, pp. 299-306, 1987.

[30] J. Mourjopoulos, "Digital Equalization Methods for Audio Systems," in Preprint 2598, AES 84th Convention, (Paris), 1988 March.

[31] J. Kuriyama and Y. Furukawa, "Adaptive Loudspeaker System," J. Audio Eng. Soc., vol. 37, no. 11, 1989 November.

[32] S. J. Elliott and P. Nelson, "Multiple-Point Equalization in a Room Using Adaptive Digital Filters," J. Audio Eng Soc., vol. 37, no. 11, November 1989.

[33] J. Mourjopoulos and M. A Pareskevas, "Pole and Zero Modelling of Room Transfer Functions," J. Sound and Vibration, vol. 146, pp. 281-302, 1994 November.

[34] R. G. Greenfeld, Application of Digital Techniques to Loudspeaker Equalization. PhD thesis, Department of Electronic Systems Engineering University of Essex, September 1991.

[35] R. Genereux, "Adaptive Filters for Loudspeakers and Rooms," in Preprint 3375, AES 98th Convention, (San Francisco), 1992 October.

[36] F. X. Y. Gao and W. M. Snelgrove, "Adaptive Linearization of a Loudspeaker," in Preprint 3377, AES 98th Convention, (San Francisco), 1992 October.

[37] J. Mourjopoulos, "Digital Equalization of Room Acoustics," J. Audio Eng. Soc., vol. 42, no. 11, 1994 November.

[38] G. Karachalios, D. Tsoukalas, and J. Mourjopoulos, "Multiband Analysis and Equalization of Loudspeaker Response," in Preprint 3975, AES 98th Convention, (Paris), 1995 February.

[39] S. Salamouris, K Politopoulos, V. Tsakiris, and J. Mourjopoulos, "Digital System for Loudspeaker and Room Equalization," in Preprint 3976, AES 98th Convention, (Paris), 1995 February.

[40] Y. Haneda, S. Makino, and Y. Kaneda, "Multiple-Point Equalization of Room Transfer Functions by Using Common Acoustical Poles," IEEE Trans. Speech and Audio Processing, vol. 5, no. 4, pp. 325-333, 1997 July.

[41] M. Karjalainen, E. Piirilä, A. Järvinen, and J. Huopaniemi, "Comparison of Loudspeaker Response Equalization Using Warped Digital Filters," J. Audio Eng. Soc., vol. 47, no. 1/2, pp. 15-31, 1999.

[42] F. Fontana, "Common Pole Equalization of Small Rooms Using a Two-Step Real-Time Digital Equalizer," in Proc. IEEE Workshop on Applications of Signal Processing to Audio and Acoustics (WASPAA '99), pp. 195-198, 1999.

[43] M. Tyril, J. A. Pedersen, and P. Rubak, "Digital Filters for Low-Frequency Equalization," J. Audio Eng. Soc., vol. 49, no. 1/2, pp. 36-43, 2001 January/February.

[44] A. Mäkivirta, P. Antsalo, M. Karjalainen, and V. Välimäki, "Low-Frequency Modal Equalization of Loudspeaker-Room Responses," in Preprint 5480, AES 111th Convention, (New York, USA), 2001 November/December.

[45] A. Mäkivirta and C. Anet, "A Survey Study of In-Situ Stereo and Multi-Channel Monitoring Conditions," in Preprint 5496, AES 111th Convention, (New York), 2001 November/December.

[46] AES Technical Commnittee on Multichannel and Binaural Audio Technology (TC-MBAT), "Multichannel Surround Sound Systems and Operations," Technical Document, version 1.5, AES, 2001.

[47] EBU Document Tech. 3276-1998 (Second ed.), "Listening Condition for the Assessment of Sound Programme Material: Monophonic and Two-Channel Stereophonic," EBU, 1998.

[48] J. O. Smith, "Physical Modeling Using Digital Waveguides," Computer Music J., vol. 16, no. 4, pp. 74-91, 1992.

[49] V. Välimäki, J. Huopaniemi, M. Karjalainen, and Z. Jánosy, "Physical Modeling of Plucked String Instruments with Application to Real-Time Sound Synthesis," J. Audio Eng. Soc., vol. 44, no. 5, pp. 331-353, May 1996.

[50] J. O. Smith, Techniques for Digital Filter Design and System Identification with Application to the Violin. PhD thesis, CCRMA, Dept. of Music, Stanford University, Stanford, Calif., June 1983, Report STAN-M-14.

[51] M. Sandler, "Algorithm for High Precision Root Finding from High Order LPC Models," IEE Proceedings I on Communications, Speech and Vision, vol. 138, no. 6, pp.596-602, 1991 December.

[52] M. Sandler, "New Synthesis Techniques for High-Order All-Pole Filters," IEE Proceedings I on Communications, Speech and Vision, vol. 139, no. 1, pp. 9-16, 1992 February.

[53] J. Laroche and J.-L. Meillier, "Multichannel Excitation/Filter Modeling of Percussive Sounds with Application to the Piano," IEEE Trans. Speech and Audio Processing, vol. 2, no. 2, pp. 329-344, 1994 April.

[54] J. Mackenzie, I. Kale, and G. D. Cain, "Applying Balanced Model Truncation to Sound Analysis/Synthesis Models," in Proc. Int. Computer Music Conf., pp. 400-403, 1995 September.

[55] M. Karjalainen, V. Välimäki, and T. Tolonen, "Plucked String Models, from the Karplus-Strong Algorithm to Digital Waveguides and Beyond," Computer Music J., vol. 22, no. 3, pp. 17-32, 1998.

The invention claimed is:

1. A method for designing a modal equalizer (5) for a low frequency audible range, including frequencies below 200 Hz for a location in a listening room therein, in which method modes to be equalized are determined at least by center frequency and decay rate of each mode in said location, creating a discrete-time description of the determined modes, and determining equalizer filter coefficients on the basis of the discrete-time description of the determined modes, and forming the equalizer (5) by means of a digital filter by defining the filter coefficients on the basis of the properties of the modes, characterized by forming a mode detection function $(G(\Omega))$, defining highest peak angular frequency $\Omega_p$ of the function $(G(\Omega))$, making AR analysis of predefined order for solving the poles of the mode representing the highest peak angular frequency, wherein AR analysis is auto-regressive analysis, selecting the pole closest to point $e^{j\Omega_p}$ on the unit circle, determining the decay time of the mode and if is over a predetermined level, designing a modal correction filter for this mode, and repeating this procedure until no decay time exceeds over the predetermined level and each individual filter obtained in previous stages of the method is combined to a cascaded modal equalization filter.

2. A method in accordance with claim 1, characterized in that the discrete-time description is a Z-transform.

3. A method in accordance with claim 1, characterized in that AR or ARMA or FZ-ARMA modeling is employed in modal parameter estimation.

4. A method in accordance with claim 1, characterized in that order 50-70 is applied for the AR-analysis.

5. A method in accordance with claim 1, characterized in that a second order correction filter of Eq. (10) is used to correct each single mode.

6. A method in accordance with claim 1, characterized in that the sound of primary speakers (3) is modified.

7. A method in accordance with claim 1, characterized in that the sound of secondary speakers (4) is modified.

8. A method in accordance with claim 2 characterized in that AR or ARMA or FZ-ARMA modeling is employed in modal parameter estimation.

9. A method in accordance with claim 2, characterized in that order 50-70 is applied for the AR-analysis.

10. A method in accordance with claim 3, characterized in that order 50-70 is applied for the AR-analysis.

11. A method in accordance with claim 2, characterized in that a second order correction filter of Eq. (10) is used to correct each single mode.

12. A method in accordance with claim 3, characterized in that a second order correction filter of Eq. (10) is used to correct each single mode.

13. A method in accordance with claim 4, characterized in that a second order correction filter of Eq. (10) is used to correct each single mode.

14. A method in accordance with claim 2, characterized in that the sound of primary speakers (3) is modified.

15. A method in accordance with claim 3, characterized in that the sound of primary speakers (3) is modified.

16. A method in accordance with claim 4, characterized in that the sound of primary speakers (3) is modified.

17. A method in accordance with claim 5, characterized in that the sound of primary speakers (3) is modified.

18. A method in accordance with claim 2, characterized in that the sound of secondary speakers (4) is modified.

19. A method in accordance with claim 3 characterized in that the sound of secondary speakers (4) is modified.

20. A method in accordance with claim 4, characterized in that the sound of secondary speakers (4) is modified.

21. A method in accordance with claim 5 characterized in that the sound of secondary speakers (4) is modified.

* * * * *